(12) United States Patent
Oomori et al.

(10) Patent No.: US 8,901,470 B2
(45) Date of Patent: Dec. 2, 2014

(54) MICROWAVE HEATING APPARATUS

(75) Inventors: Yoshiharu Oomori, Shiga (JP);
Tomotaka Nobue, Kyoto (JP); Kenji Yasui, Shiga (JP); Makoto Mihara, Nara (JP)

(73) Assignee: Panasonic Corporation, Osaka (JP)

( * ) Notice: Subject to any disclaimer, the term of this patent is extended or adjusted under 35 U.S.C. 154(b) by 856 days.

(21) Appl. No.: 13/119,050

(22) PCT Filed: Mar. 16, 2009

(86) PCT No.: PCT/JP2009/001150
§ 371 (c)(1),
(2), (4) Date: Mar. 15, 2011

(87) PCT Pub. No.: WO2010/032345
PCT Pub. Date: Mar. 25, 2010

(65) Prior Publication Data
US 2011/0168699 A1 Jul. 14, 2011

(30) Foreign Application Priority Data

Sep. 17, 2008 (JP) .................................. 2008-237397
Sep. 17, 2008 (JP) .................................. 2008-237398
Sep. 25, 2008 (JP) .................................. 2008-245832

(51) Int. Cl.
*H05B 6/66* (2006.01)
*H05B 6/68* (2006.01)
*H05B 6/72* (2006.01)
*H05B 6/70* (2006.01)
*H01L 21/67* (2006.01)

(52) U.S. Cl.
CPC ............... *H05B 6/686* (2013.01); *H05B 6/705* (2013.01); *Y02B 40/143* (2013.01); *H01L 21/67115* (2013.01); *H05B 2206/044* (2013.01); *Y02B 40/146* (2013.01)
USPC ............ 219/748; 219/702; 219/716; 219/761

(58) Field of Classification Search
CPC .. H05B 6/686; H05B 6/705; H05B 2206/044; Y02B 40/143; Y02B 40/146
USPC ........ 219/702, 751, 756, 746, 679, 680, 681, 219/678, 682, 686, 701, 730, 757, 759, 754, 219/762, 716, 761, 748; 426/107, 234, 241, 426/243, 395; 126/21 A, 21 R, 19 R, 299 D
See application file for complete search history.

(56) References Cited

U.S. PATENT DOCUMENTS

| | | | |
|---|---|---|---|
| 2006/0081624 A1 | 4/2006 | Takada et al. | |
| 2010/0176121 A1 | 7/2010 | Nobue et al. | |
| 2010/0224623 A1* | 9/2010 | Yasui et al. | ................... 219/702 |

FOREIGN PATENT DOCUMENTS

CN            1764332 A      4/2006

(Continued)

OTHER PUBLICATIONS

International Search Report for International Application No. PCT/JP2009/001150, dated Jun. 16, 2009, 2 pages.

(Continued)

*Primary Examiner* — Quang Van
(74) *Attorney, Agent, or Firm* — Brinks Gilson & Lione

(57) ABSTRACT

In a microwave heating apparatus of the invention, microwaves from oscillation parts 1a, 1b are divided into a plurality of microwaves by power division parts 2a, 2b and inputted to amplification parts 4a, 4b, 4c, 4d, and desired microwave powers from the amplification parts are supplied from feeding parts 5a, 5b, 5c, 5d to a heating chamber 8. Reflected powers reflected from the heating chamber to the amplification parts via the feeding parts are detected by power detection parts 6a, 6b, 6c, 6d. Each of the feeding parts has a plurality of antennas for supplying the microwaves having different characteristics to the heating chamber, and a control part 7 extracts an oscillating frequency with which the reflected powers detected by the power detection parts are minimum, and causes the oscillation parts to oscillate at the extracted oscillating frequency so as to supply the microwaves having the different characteristics from the plurality of antennas to the heating chamber.

14 Claims, 9 Drawing Sheets

(56) References Cited

FOREIGN PATENT DOCUMENTS

| | | |
|---|---|---|
| JP | 52-084543 A | 7/1977 |
| JP | 56-132793 A | 10/1981 |
| JP | 60-143593 A | 7/1985 |
| JP | 02-155194 A | 6/1990 |
| JP | 2008-066292 A | 3/2008 |
| JP | 2008066292 A * | 3/2008 |
| JP | 2008-108491 A | 5/2008 |

OTHER PUBLICATIONS

International Preliminary Report on Patentability for International Application No. PCT/JP2009/001150, dated Apr. 19, 2011, 10 pages.

* cited by examiner

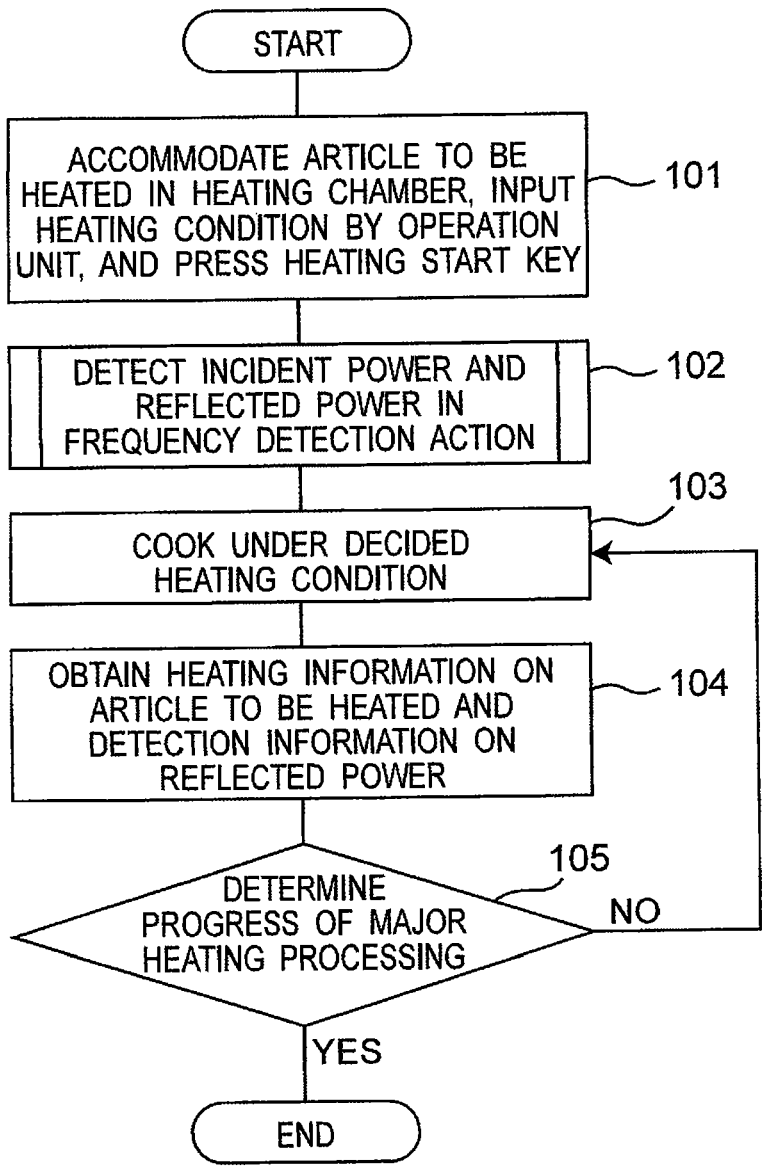

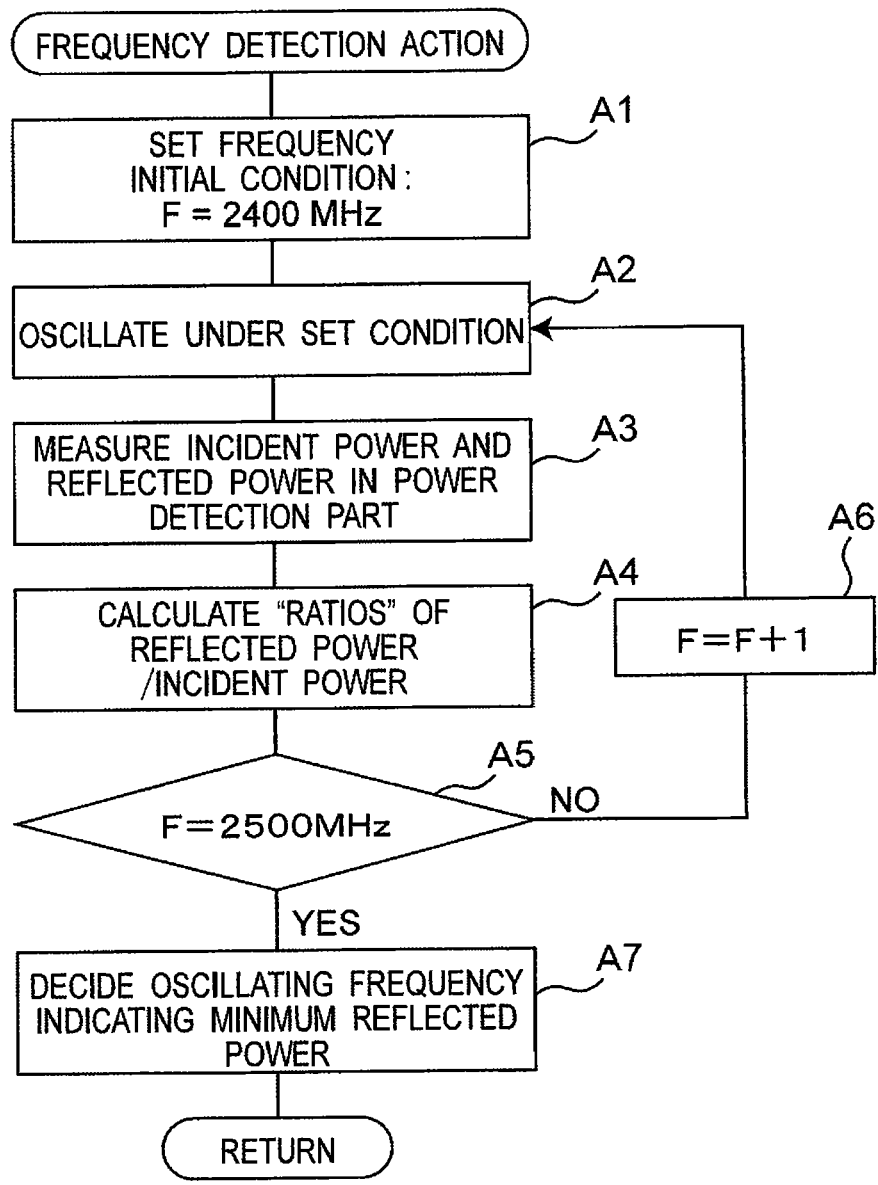

MICROWAVE HEATING APPARATUS

TECHNICAL FIELD

The present invention relates to a microwave heating apparatus including a microwave generation part formed with using a semiconductor element.

BACKGROUND ART

As a conventional microwave heating apparatus of this type, for example, there is a high-frequency heating apparatus disclosed in Japanese Unexamined Patent Publication No. 56-132793. This conventional high-frequency heating apparatus includes a seed oscillator formed with using a semiconductor element, a divider for dividing an output of this seed oscillator into a plurality of outputs, a plurality of amplifiers for respectively amplifying the divided outputs, a phase shifter provided in one of paths between the divider and the amplifiers, a synthesizer for synthesizing outputs of the amplifiers again, and a plurality of antennas. The synthesizer in this conventional high-frequency heating apparatus has the substantially same configuration as that of the divider and is used so that an input and an output are opposite to each other. This synthesizer is formed with using a 90-degree hybrid coupler formed by a microstrip line, a 180-degree hybrid coupler, or the like, and has two synthesizer outputs. Therefore, by controlling the phase shifter provided in one of the paths between the divider and the amplifiers, a power ratio between the two synthesizer outputs can be changed, or phases between the two synthesizer outputs can be changed to the same phases or the opposite phases.

As another conventional microwave heating apparatus, for example, there is a high-frequency heating apparatus disclosed in Japanese Unexamined Patent Publication No. 52-84543. In this conventional high-frequency heating apparatus, solid high-frequency oscillators operated independently from each other are provided on one or more of E surfaces serving as electric field surfaces in wall surfaces forming a waveguide, H surfaces serving as magnetic field surfaces, and short surfaces serving as end surfaces of the waveguide and being orthogonal to the E surfaces and the H surfaces. In this conventional high-frequency heating apparatus, by emitting microwaves into the waveguide via couplers of the solid high-frequency oscillators and supplying the microwaves to a heating chamber via the waveguide, impedance matching is easily performed.

PLT 1: Japanese Unexamined Patent Publication No. 56-132793

PLT 2: Japanese Unexamined Patent Publication No. 52-84543

SUMMARY OF INVENTION

Technical Problem

In the above conventional high-frequency heating apparatuses, by changing the phases of the microwaves emitted from the two outputs of the synthesizer by the phase shifter, an emitting power ratio from two antennas and a phase difference can be arbitrarily and instantaneously changed. However, in the conventional high-frequency heating apparatus formed in such a way, there is a problem that it is difficult to highly efficiently heat various articles to be heated of different shapes, kinds, or amounts accommodated in the heating chamber to which the microwaves are supplied.

In the conventional high-frequency heating apparatuses, in a case where the microwaves are supplied by the plurality of antennas, proper measures are not implemented against a change in reflected power due to the phase difference, changes in the phases due to an oscillating frequency, reflection of the microwaves from the inside of the heating chamber, and generation of microwave transmission between a plurality of feeding parts for supplying the microwaves to the heating chamber, and there is a problem that highly efficient heating processing is not performed.

The present invention is to solve the problems in the above conventional microwave heating apparatus, and an object thereof is to provide a highly reliable microwave heating apparatus for highly efficiently heating various articles to be heated of different shapes, kinds, and amounts accommodated in a heating chamber to which microwaves are supplied. With the microwave heating apparatus of the present invention, a plurality of feeding parts each having a function of emitting the microwaves is optimally arranged on wall surfaces of the heating chamber, a frequency detection action on a frequency with which a reflected power is minimum is performed, one of the feeding parts suitable for heating the article to be heated is selected based on a detection result, and the microwaves are supplied, so that the various articles to be heated of the different shapes, kinds and amounts can be highly efficiently heated.

Solution to Problem

According to a first aspect of the present invention, a microwave heating apparatus includes: a heating chamber accommodating an article to be heated; an oscillation part for generating microwaves; a power division part for dividing an output of the oscillation part into a plurality of outputs and outputting the divided outputs; amplification parts for respectively amplifying the outputs of the power division part; feeding parts for respectively supplying outputs of the amplification parts to the heating chamber; power detection parts for detecting reflected powers transmitted from the heating chamber to the amplification parts via the feeding parts; and a control part for controlling an oscillating frequency of the oscillation part, wherein each of the feeding parts has a plurality of antennas for supplying the microwaves having different characteristics to the heating chamber, and the control part extracts the oscillating frequency at which a minimum reflected power is detected by the power detection parts, and causes the oscillation part to oscillate at the extracted oscillating frequency so as to supply the microwaves having the different characteristics from the plurality of antennas to the heating chamber. With the microwave heating apparatus of the first aspect formed in such a way, the microwaves at the frequency suitable for heating the article to be heated are supplied into the heating chamber. Thus, the microwaves emitted to the heating chamber can be effectively absorbed by the article to be heated, so that various articles to be heated of different shapes, kinds, and amounts can be highly efficiently heated.

In a microwave heating apparatus according to a second aspect of the present invention, the output of one of the amplification parts is supplied to the plurality of antennas in the first aspect. With the microwave heating apparatus of the second aspect formed in such a way, a plurality of microwave powers can be optimally supplied from a plurality of points to the heating chamber with a simple configuration, so that the various articles to be heated of the different shapes, kinds, and amounts can be highly efficiently heated with the simple configuration.

In a microwave heating apparatus according to a third aspect of the present invention, the plurality of antennas in the second aspect emits the microwaves running in different excitation directions. With the microwave heating apparatus of the third aspect formed in such a way, the plurality of microwave powers running in the different excitation directions is supplied from a plurality of points to the heating chamber. With the microwaves running in the different excitation directions from the plurality of antennas, microwave transmission between the antennas can be suppressed, so that the article to be heated can be highly efficiently heated.

In a microwave heating apparatus according to a fourth aspect of the present invention, the plurality of antennas in the second aspect has frequency characteristics with which frequency values indicating minimum reflected powers are different from each other. With the microwave heating apparatus of the fourth aspect formed in such a way, by using the plurality of antennas having the frequency characteristics with which the frequency values indicating the best emission efficiency of the microwave powers, the microwave powers are supplied from a plurality of points to the heating chamber. Therefore, with the microwave heating apparatus of the fourth aspect, an optimal frequency can be selected from a wide frequency range upon microwave emission to the heating chamber, so that the microwave emitted to the heating chamber can be efficiently absorbed by the article to be heated under a more optimal heating condition. As a result, with the microwave heating apparatus of the fourth aspect, the antenna for mainly feeding is selected in accordance with the shape, the kind, and the amount of the article to be heated in the heating chamber, so that highly efficient heating can be performed to the various articles to be heated.

In a microwave heating apparatus according to a fifth aspect of the present invention, each of the feeding parts in the first aspect integrally has the plurality of antennas, and the plurality of antennas emits the microwaves having the different characteristics to the heating chamber. With the microwave heating apparatus of the fifth aspect formed in such a way, the plurality of microwave powers can be supplied to the heating chamber with a simple configuration, so that the various articles to be heated of the different shapes, kinds, and amounts can be highly efficiently heated with the simple configuration.

In a microwave heating apparatus according to a sixth aspect of the present invention, the outputs of the plurality of amplification parts are respectively and correspondingly supplied to the plurality of antennas in one of the feeding parts in the fifth aspect. With the microwave heating apparatus of the sixth aspect formed in such a way, the microwave powers having different characteristics can be supplied from the integrated antennas to the heating chamber. Thus, the plurality of microwave powers can be supplied from a suitable antenna in accordance with the shape, the kind, and the amount of the article to be heated in the heating chamber, so that the highly efficient heating can be performed to the various articles to be heated.

In a microwave heating apparatus according to a seventh aspect of the present invention, the plurality of antennas in the sixth aspect emits the microwaves running in different excitation directions. With the microwave heating apparatus of the seventh aspect formed in such a way, the excitation directions of the microwaves from the plurality of antennas are different from each other. Thus, interference between the microwaves is suppressed, so that optimal microwaves can be respectively supplied from the antennas into the heating chamber. With the microwave heating apparatus of the seventh aspect, the plurality of microwaves running in the different excitation directions can be supplied from a plurality of points to the heating chamber, and the microwaves emitted into the heating chamber can be efficiently absorbed by the article to be heated. Thus, the various articles to be heated of the different shapes, kinds, and amounts can be highly efficiently heated.

In a microwave heating apparatus according to a eighth aspect of the present invention, each of the feeding parts having the plurality of antennas in the sixth aspect is a patch antenna having a plurality of feeding points. With the microwave heating apparatus of the eighth aspect formed in such a way, the plurality of microwave powers can be supplied to the heating chamber with a simple configuration, so that the various articles to be heated of the different shapes, kinds, and amounts can be highly efficiently heated with the simple configuration.

In a microwave heating apparatus according to a ninth aspect of the present invention, the output of one of the amplification parts is supplied to the plurality of antennas in the first aspect, and at least one of the plurality of antennas is integrated with another antenna to which an output of the other amplification part is supplied. With the microwave heating apparatus of the ninth aspect formed in such a way, the plurality of microwave powers can be supplied to the heating chamber with a simple configuration, so that the various articles to be heated of the different shapes, kinds, and amounts can be highly efficiently heated with the simple configuration.

In a microwave heating apparatus according to a tenth aspect of the present invention, at least one of the plurality of antennas to which the output of one of the amplification parts in the ninth aspect is supplied and the other antenna to which the output of the other amplification part is supplied emit the microwaves running in different excitation directions. With the microwave heating apparatus of the tenth aspect formed in such a way, the plurality of microwave powers in the different excitation directions can be supplied from a plurality of points to the heating chamber, so that the various articles to be heated of the different shapes, kinds, and amounts can be highly efficiently heated.

In a microwave heating apparatus according to a eleventh aspect of the present invention, the plurality of antennas to which the output of one of the amplification parts in the ninth aspect is supplied has frequency characteristics with which frequency values indicating minimum reflected powers are different from each other. With the microwave heating apparatus of the eleventh aspect formed in such a way, the plurality of microwave powers having the different frequency values indicating the minimum reflected power is supplied from a plurality of points to the heating chamber, and the oscillating frequency of the oscillation part is controlled by the control part in accordance with a frequency with which the emission efficiency of the microwave power is the best. Therefore, with the microwave heating apparatus of the eleventh aspect, by controlling the oscillating frequency of the oscillation part by the control part based on detection results of the power detection parts, the antenna for emitting the microwave is substantially selected, so that the microwave emitted into the heating chamber can be efficiently absorbed by the article to be heated. As a result, with the microwave heating apparatus of the eleventh aspect, the antenna for mainly feeding is selected in accordance with the shape, the kind, and the amount of the article to be heated in the heating chamber, so that the highly efficient heating can be performed to the various articles to be heated.

In a microwave heating apparatus according to a twelfth aspect of the present invention, the plurality of antennas to which the output of one of the amplification parts in the ninth aspect is supplied emits the microwaves running in different excitation directions. With the microwave heating apparatus of the twelfth aspect formed in such a way, the plurality of microwave powers in the different excitation directions can be supplied from a plurality of points to the heating chamber, so that the various articles to be heated of the different shapes, kinds, and amounts can be highly efficiently heated.

A microwave heating apparatus according to a thirteenth aspect of the present invention further includes: a diffusive microwave power supply part in which the output of one of the amplification parts is supplied to the plurality of antennas provided in each of the feeding parts in the first aspect, and the plurality of microwaves having the different characteristics is supplied from the plurality of antennas to the heating chamber, wherein the power detection parts are provided in microwave transmission passages between the amplification parts and the feeding parts so as to detect the reflected powers. With the microwave heating apparatus of the thirteenth aspect formed in such a way, all the microwave powers reflected to one of the amplification parts can be detected by one of the power detection parts. Thus, a detection action and a control action are easily performed, so that the feeding part having the antennas for emitting the microwaves is started up and the microwaves emitted into the heating chamber can be efficiently absorbed by the article to be heated. In such a way, with the microwave heating apparatus of the thirteenth aspect, by surely detecting the reflected powers by the power detection parts, the minimum reflected power can be detected with high precision, so that the various articles to be heated of the different shapes, kinds, and amounts can be highly efficiently heated.

A microwave heating apparatus according to a fourteenth aspect of the present invention further includes: an intensive microwave power supply part in which each of the feeding parts in the first aspect integrally has the plurality of antennas, the outputs of the plurality of amplification parts are respectively supplied to the plurality of antennas, and the plurality of microwaves having the different characteristics is supplied from the plurality of antennas to the heating chamber, wherein the power detection parts are provided in microwave transmission passages between the amplification parts and the feeding parts so as to detect the reflected powers. In such a way, with the microwave heating apparatus of the fourteenth aspect, the power detection parts for detecting the microwave powers reflected from the feeding parts each integrally having the plurality of antennas in the directions of the plurality of amplification parts are respectively provided between the amplification parts and the feeding parts. Thus, the microwave powers reflected to the plurality of amplification parts are respectively detected by the separate power detection parts. Therefore, with the microwave heating apparatus of the fourteenth aspect, even when the feeding part is shared, the reflected powers having the different characteristics can be separately detected, so that the heating condition suitable for the article to be heated can be highly precisely detected. As a result, with the microwave heating apparatus of the fourteenth aspect, the microwaves emitted into the heating chamber can be highly efficiently absorbed by the article to be heated, so that the various articles to be heated of the different shapes, kinds, and amounts can be highly efficiently heated with a simple configuration.

In a microwave heating apparatus according to a fifteenth aspect of the present invention, the feeding parts in the first aspect includes a first feeding part and a second feeding part, the microwave heating apparatus further includes: a diffusive microwave power supply part in which the output of one of the amplification parts is supplied to the plurality of antennas provided in the first feeding part, and the plurality of microwaves having the different characteristics is supplied from the plurality of antennas of the first feeding part to the heating chamber; and an intensive microwave power supply part in which the second feeding part integrally has the plurality of antennas, the outputs of the plurality of amplification parts are respectively supplied to the plurality of antennas of the second feeding part, and the plurality of microwaves having the different characteristics is supplied from the plurality of antennas of the second feeding part to the heating chamber, wherein the power detection parts are provided in microwave transmission passages between the amplification parts and the feeding parts so as to detect the reflected powers. With the microwave heating apparatus of the fifteenth aspect formed in such a way, all the microwave powers reflected to one of the amplification parts can be detected by one of the power detection parts. Thus, the detection action and the control action are easily performed, so that the feeding part for substantially emitting the microwaves can be easily optimally selected. With the microwave heating apparatus of the fifteenth aspect, the microwave powers reflected to the plurality of amplification parts are respectively detected by the separate power detection parts. Thus, even when the feeding part integrally having the plurality of antennas is shared, the reflected powers having the different characteristics can be separately detected, so that the heating condition suitable for the article to be heated can be highly precisely detected. As a result, with the microwave heating apparatus of the fifteenth aspect, the microwaves emitted into the heating chamber can be highly efficiently absorbed by the article to be heated, so that the various articles to be heated of the different shapes, kinds, and amounts can be highly efficiently heated with a simple configuration.

Advantageous Effects of Invention

With the microwave heating apparatus of the present invention, the plurality of feeding parts each having a function of emitting the microwaves are optimally arranged on wall surfaces of the heating chamber, the frequency detection action of the frequency with which the reflected power is minimum is performed, the feeding part suitable for heating the article to be heated is selected based on the detection results, and the microwaves are supplied, so that the various articles to be heated of the different shapes, kinds and amounts can be highly efficiently heated.

BRIEF DESCRIPTION OF THE DRAWINGS

FIG. 4 is a flowchart of a heating action in the microwave heating apparatus of the first embodiment.

FIG. 5 is a flowchart showing a frequency detection action in the heating action in the microwave heating apparatus of the first embodiment.

DETAILED DESCRIPTION OF THE PREFERRED EMBODIMENTS

Preferred embodiments according to a microwave heating apparatus of the present invention will be described with reference to the attached drawings. It should be noted that although a microwave oven will be described as the microwave heating apparatus in the following embodiments, the microwave oven is only an example. Thus, the microwave heating apparatus of the present invention is not limited to the microwave oven but may be a different microwave heating apparatus such as a heating apparatus utilizing dielectric heating, a disposer, or a semiconductor manufacturing apparatus. The present invention is not limited to specific configurations in the following embodiments but includes configurations based on the similar technological thoughts.

First Embodiment

Figure 1:
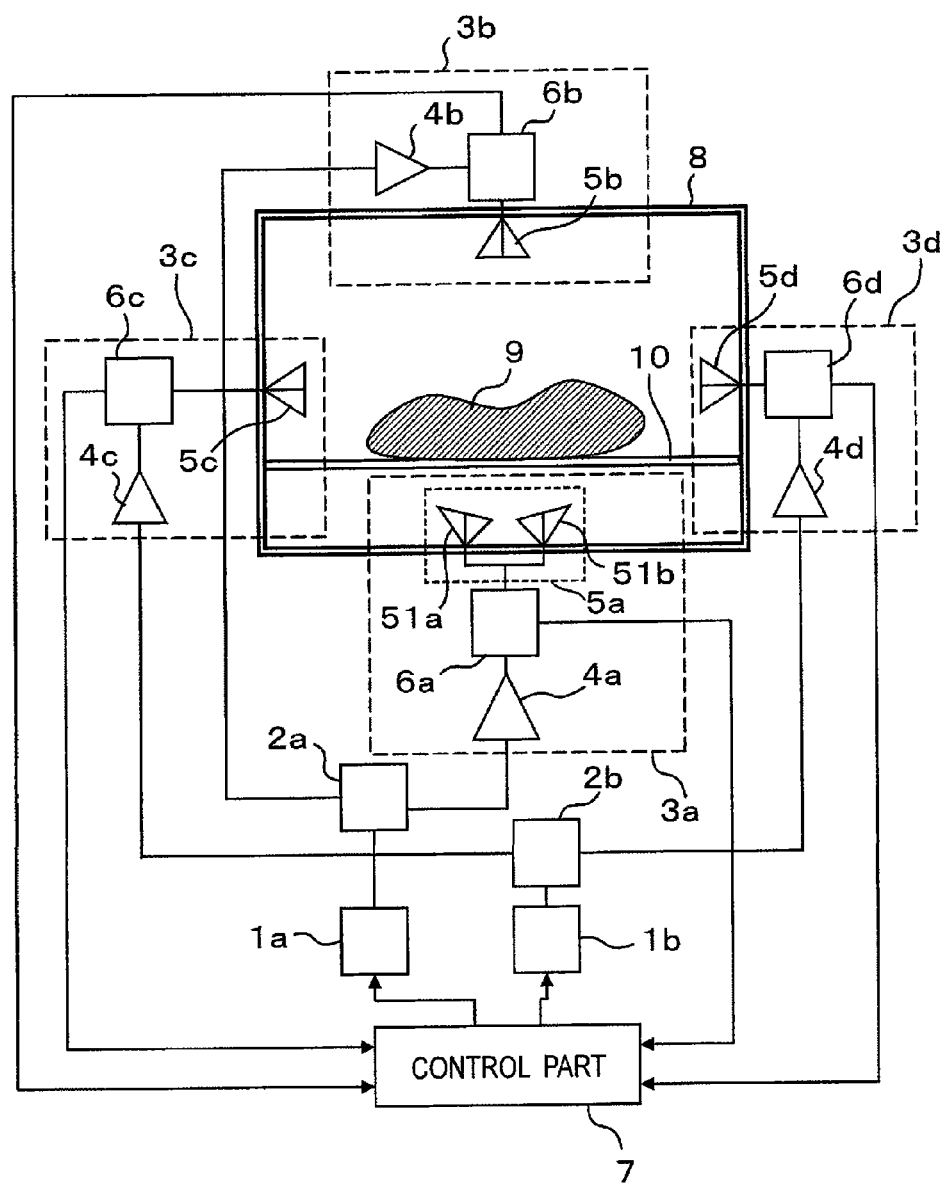
FIG. 1 is a block diagram showing a configuration of a microwave generation part in a microwave heating apparatus of a first embodiment according to the present invention.

FIG. 1 is a block diagram showing a configuration of a microwave generation part in a microwave heating apparatus of a first embodiment according to the present invention.

In FIG. 1, the microwave generation part has two oscillation parts 1a, 1b formed with using semiconductor elements, power division parts 2a, 2b for respectively dividing outputs of the oscillation parts 1a, 1b into two outputs, microwave power supply parts 3a, 3b, 3c, 3d for amplifying the outputs of the power division parts 2a, 2b so as to form microwave powers and feeding the microwave powers to a heating chamber 8, and a control part 7 for controlling oscillating frequencies in the microwave power supply parts 3a, 3b, 3c, 3d. The microwave power supply parts 3a, 3b, 3c, 3d respectively have amplification parts 4a, 4b, 4c, 4d for amplifying the outputs of the power division parts 2a, 2b, feeding parts 5a, 5b, 5c, 5d for feeding the microwave powers amplified in the amplification parts 4a, 4b, 4c, 4d to the heating chamber 8, and power detection parts 6a, 6b, 6c, 6d inserted to microwave transmission passages respectively connecting the amplification parts 4a, 4b, 4c, 4d and the feeding parts 5a, 5b, 5c, 5d. The amplification parts 4a, 4b, 4c, 4d are formed with using semiconductor elements. The power detection parts 6a, 6b, 6c, 6d detect reflected powers reflected from the inside of the heating chamber 8 to the amplification parts 4a, 4b, 4c, 4d via the feeding parts 5a, 5b, 5c, 5d. The control part 7 controls the oscillating frequencies of the oscillation parts 1a, 1b in accordance with the reflected powers detected by the power detection parts 6a, 6b, 6c, 6d.

As shown in FIG. 1, the microwave heating apparatus of the first embodiment accommodates an article to be heated 9 and emits microwaves outputted from the microwave power supply parts 3a, 3b, 3c, 3d. In the heating chamber 8, a door for bringing the article to be heated 9 in and out (not shown) is provided on one wall surface forming the heating chamber 8. In the heating chamber 8, wall surfaces other than the wall surface on which the door is provided are formed by closure plates made of metal materials so that the microwaves emitted into the heating chamber 8 are enclosed inside the heating chamber. A base 10 on which the article to be heated 9 is mounted is provided in the heating chamber 8.

In the microwave heating apparatus of the first embodiment, the feeding parts 5a, 5b, 5c, 5d for emitting the microwaves generated in the oscillation parts 1a, 1b into the heating chamber 8 are respectively arranged on the wall surfaces forming the heating chamber 8. In the microwave heating apparatus of the first embodiment, the first feeding part 5a is arranged on the bottom wall surface, the second feeding part 5b is arranged on the ceiling wall surface, the third feeding part 5c is arranged on the left wall surface (the wall surface on the left side in FIG. 1), and the fourth feeding part 5d is arranged on the right wall surface (the wall surface on the right side in FIG. 1).

In the present invention, arrangement of the feeding parts 5a, 5b, 5c, 5d is not limited to the configuration of the first embodiment shown in FIG. 1. For example, the plurality of feeding parts may be provided on any one of the wall surfaces, or the feeding parts from the same power division part may be arranged on the wall surfaces not facing each other, for example, the adjacent wall surfaces such as the right wall surface and the bottom wall surface. In such a way, in the microwave heating apparatus of the present invention, the arrangement of the feeding parts on the wall surfaces is not limited, but the arrangement of the feeding parts is appropriately set in accordance with a purpose of use and the like of the microwave heating apparatus.

As shown in FIG. 1, the first feeding part 5a in the microwave heating apparatus of the first embodiment is provided on the bottom wall surface below the base 10. The first feeding part 5a has two antennas 51a, 51b provided at different positions on the bottom wall surface. Radiation antennas such as patch antennas and monopole antennas are used as the antennas 51a, 51b. In the microwave heating apparatus of the first embodiment, two patch antennas are used as the two antennas 51a, 51b.

As described above, in the microwave heating apparatus of the first embodiment, the first microwave power supply part 3a is formed by the first feeding part 5a having the two antennas 51a, 51b, the first amplification part 4a, and the first power detection part 6a. Similarly, the second microwave power supply part 3b is formed by the second feeding part 5b, the second amplification part 4b, and the second power detection part 6b, the third microwave power supply part 3c is formed by the third feeding part 5c, the third amplification part 4c, and the third power detection part 6c, and the fourth microwave power supply part 3d is formed by the fourth feeding part 5d, the fourth amplification part 4d, and the fourth power detection part 6d. In the microwave heating apparatus of the first embodiment, the first feeding part 5a has the two antennas 51a, 51b, and the other second to fourth feeding parts 5b, 5c, 5d respectively have one antenna. However, the present invention is not limited to such a configuration but the second to fourth feeding parts 5b, 5c, 5d can respectively have two antennas.

As described above, since the first microwave power supply part 3a has the two antennas 51a, 51b, the microwave heating apparatus of the first embodiment has a function of emitting the microwaves from two positions on the bottom wall surface into the heating chamber 8. The two antennas 51a, 51b provided in the first microwave power supply part 3a have different specifications to each other. The different specifications of the two antennas 51a, 51b are that the excitation directions of the microwaves emitted to the heating chamber 8 are different from each other. Detailed description relating to the antennas 51a, 51b will be described later. It should be noted that in the following description, the excitation directions indicate the directions of electric fields generated in the vicinity of the antennas when the microwaves are emitted from the antennas into the heating chamber 8.

The amplification parts 4a, 4b, 4c, 4d in the microwave heating apparatus of the first embodiment are formed by circuits having conductive patterns formed on one side surface of a dielectric substrate which is made of a low dielectric loss material. In order to preferably operate the semiconductor elements serving as amplifying elements of the microwave amplification parts 4a, 4b, 4c, 4d, matching circuits are respectively provided on the input sides and the output sides of the semiconductor elements. The power division parts 2a, 2b may be in-phase power dividers for generating no phase difference between outputs such as Wilkinson power dividers, or may be power dividers of generating a phase difference between the outputs such as branch line power dividers and rat-race power dividers. Substantially ½ of the microwave powers inputted from the oscillation parts 1a, 1b is propagated to the outputs divided by the power division parts 2a, 2b.

The power detection parts 6a, 6b, 6c, 6d provided between the amplification parts 4a, 4b, 4c, 4d and the feeding parts 5a, 5b, 5c, 5d extract the powers of the microwaves reflected from the heating chamber 8 to the amplification parts 4a, 4b, 4c, 4d via the feeding parts 5a, 5b, 5c, 5d, so-called reflected waves (the reflected powers). The power detection parts 6a, 6b, 6c, 6d are formed by directional couplers having coupling degrees of about 40 dB, for example, and extract power signals indicating power amounts of about 1/10000 of the reflected powers. The power signals are respectively rectified by detection diodes (not shown) and smoothed by capacitors (not shown), and output signals thereof are inputted to the control part 7.

The control part 7 controls drive powers respectively supplied to the oscillation parts 1a, 1b and the amplification parts 4a, 4b, 4c, 4d based on setting information indicating a heating condition for the article to be heated 9 directly inputted by a user (such as heating action time), heating information indicating a heating state of the article to be heated during heating (such as a surface temperature), and detection information from the power detection parts 6a, 6b, 6c, 6d (amounts of the reflected powers). In such a way, since the control part 7 controls the oscillation parts 1a, 1b and the amplification parts 4a, 4b, 4c, 4d, the article to be heated 9 accommodated in the heating chamber 8 is optimally heated.

Next, specific configurations of the two antennas 51a, 51b provided in the first microwave power supply part 3a in the microwave heating apparatus of the first embodiment will be described.

In the first embodiment, the circular patch antennas with diameters of 47 mm are used as both the first antenna 51a and the second antenna 51b. The first antenna 51a and the second antenna 51b are arranged at the different positions on the bottom wall surface of the heating chamber 8, and the excitation directions thereof are different by 90 degrees. In such a way, since the excitation directions are orthogonal to each other, generation of a transmission power between the first antenna 51a and the second antenna 51b is suppressed. The first antenna 51a and the second antenna 51b may be arranged at equal distances to a part immediately below a center of a position where the article to be heated 9 is mounted, or may be arranged side by side in the vicinity of the part immediately below the center.

Figure 2A:
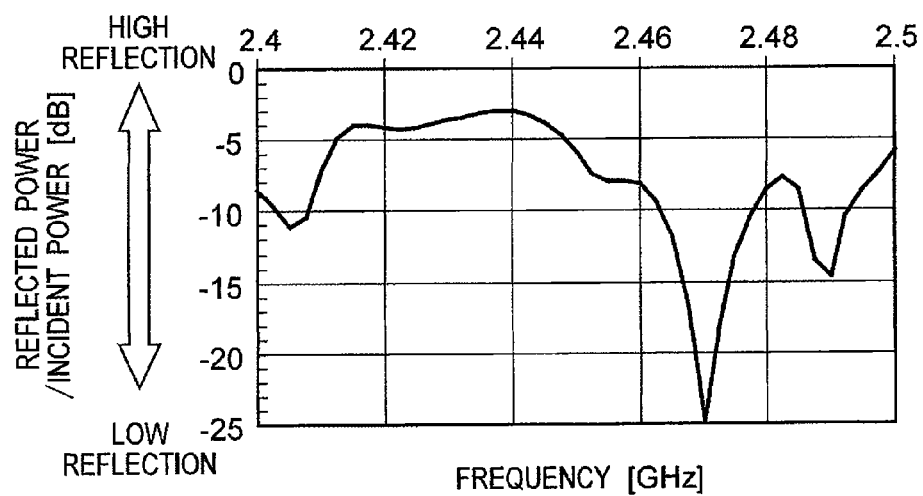
FIG. 2A is a frequency characteristic diagram relating to reflected power in a case where a first antenna is used in the microwave heating apparatus of the first embodiment.
Figure 2B:
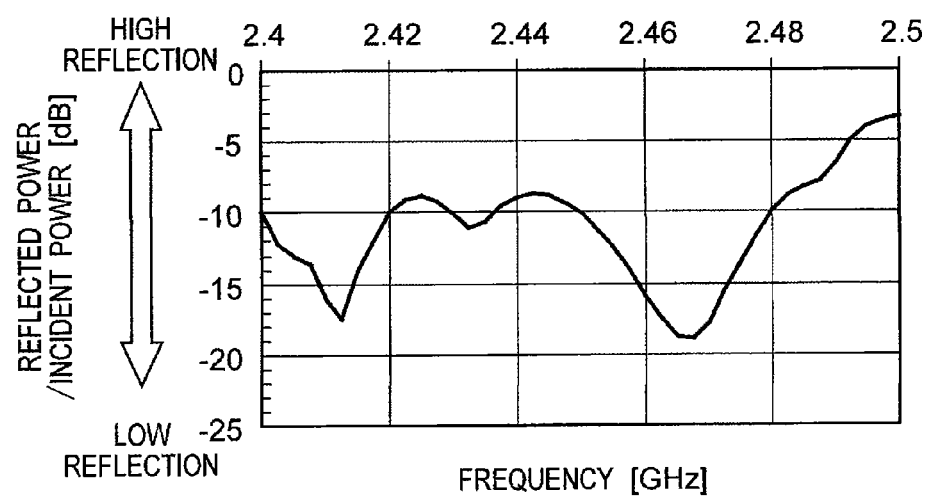
FIG. 2B is a frequency characteristic diagram relating to the reflected power in a case where a second antenna having the different excitation direction from the first antenna is used in the microwave heating apparatus of the first embodiment.

FIG. 2A shows a frequency characteristic relating to the reflected power of the microwave emitted by the first antenna 51a, and measurement was performed in a preliminarily set constant load state. FIG. 2B shows a frequency characteristic relating to the reflected power of the microwave emitted by the second antenna 51b, and the measurement was performed in the same load state as the frequency characteristic of the first antenna 51a shown in FIG. 2A. In each of FIGS. 2A and 2B, the vertical axis indicates a ratio of the reflected power to the incident power ("reflected power/incident power"), and the horizontal axis indicates the oscillating frequency. The incident power indicates the microwave power emitted from the feeding part to the heating chamber.

As shown in FIGS. 2A and 2B, the frequency characteristics of the first antenna 51a and the second antenna 51b show similar frequency characteristics in the same load state. That is, antennas having the frequency characteristics with which the ratios of the reflected powers to the incident powers are the lowest in the vicinity of the frequency of 2.47 GHz are selected as the first antenna 51a and the second antenna 51b.

Figure 3A:
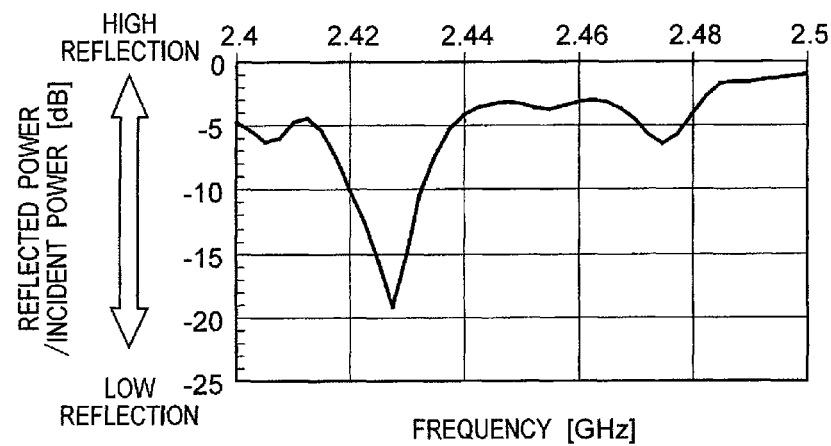
FIG. 3A is a frequency characteristic diagram relating to the reflected power in a case where a patch antenna with a diameter of 50 mm is used in the microwave heating apparatus of the first embodiment.
Figure 3B:
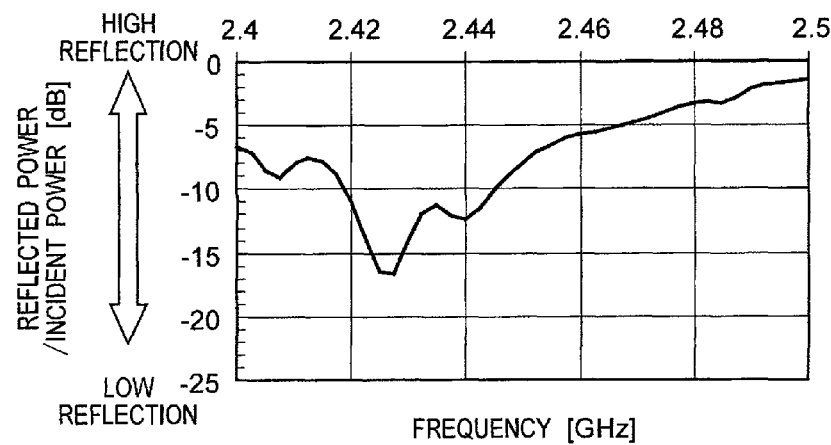
FIG. 3B is a frequency characteristic diagram relating to the reflected power in a case where an antenna with a diameter of 50 mm having a different excitation direction from the antenna having the frequency characteristic shown in FIG. 3A is used in the microwave heating apparatus of the first embodiment.

It should be noted that in the microwave heating apparatus of the first embodiment, similar experiments were performed with a microwave heating apparatus provided with patch antennas having frequency characteristics shown in FIGS. 3A and 3B with diameters of 50 mm as the other circular patch antennas. With the two antennas shown in FIGS. 3A and 3B, the measurement was performed in the same load state. In the following microwave heating apparatus of the first embodiment, the microwave heating apparatus using the circular patch antennas with the diameters of 47 mm will be described. However, even when the microwave heating apparatus are formed so that the patch antennas with the diameters of 50 mm shown in FIGS. 3A and 3B are used and the excitation directions thereof are orthogonal to each other, the same effects are obtained.

In the first microwave power supply part 3a in the microwave heating apparatus of the first embodiment, an output of one amplification part 4a is supplied to the two antennas 51a, 51b provided in the first feeding part 5a, and the plurality of microwaves having different characteristics can be emitted from the antennas 51a, 51b into the heating chamber 8. The first microwave power supply part 3a in the microwave heating apparatus of the first embodiment formed in such a way is called as a diffusive microwave power supply part.

Next, a heating action in the microwave heating apparatus of the first embodiment formed as above will be described with reference to attached flowcharts of FIGS. 4 and 5. FIG. 4 is the flowchart showing a main action of the heating action in the microwave heating apparatus of the first embodiment. FIG. 5 is the flowchart showing a frequency detection action in the flowchart shown in FIG. 4.

Firstly, the article to be heated 9 is accommodated in the heating chamber 8, and the heating condition for the article to be heated 9 is inputted in an operation part (not shown). When the heating condition is inputted and a heating start key is pressed, a heating start signal is generated (Step 101 in FIG. 4). The control part 7 to which the heating start signal is inputted starts up a drive power supply (not shown) and respectively supplies drive power voltages to the oscillation parts 1a, 1b and the amplification parts 4a, 4b, 4c, 4d so as to start the frequency detection action (Step 102 in FIG. 4).

In the flowchart showing the frequency detection action shown in FIG. 5, the control part 7 inputs control signals for setting an initial oscillating frequency of the oscillation parts 1a, 1b to for example 2400 MHz to the oscillation parts 1a, 1b (Step A1). The oscillation parts 1a, 1b to which the control signals are inputted oscillate at the initial oscillating frequency (Step A2). Outputs of the oscillation parts 1a, 1b are respectively substantially divided into two in the power division parts 2a, 2b so as to be four microwave power signals. The microwave power signals are respectively inputted to the amplification parts 4a, 4b, 4c, 4d controlled by the control part 7. The microwave power signals inputted to the amplification parts 4a, 4b, 4c, 4d which are operated in parallel are amplified to predetermined powers, respectively outputted to the feeding parts 5a, 5b, 5c, 5d via the power detection parts 6a, 6b, 6c, 6d, and emitted into the heating chamber 8.

In an initial stage of the frequency detection action in the microwave heating apparatus of the first embodiment, the microwave power of less than 100 W at for example 2400 MHz is the output power. The oscillating frequency of the oscillation parts 1a, 1b is changed to be a higher frequency from 2400 MHz in the initial stage at a 1 MHz pitch (for example 1 MHz per 10 milliseconds), and changed to be 2500 MHz serving as an upper limit of a frequency variable range. In this frequency variable action, the power detection parts 6a, 6b, 6c, 6d respectively measure the reflected powers propagated from the heating chamber 8 to the amplification parts 4a, 4b, 4c, 4d via the feeding parts 5a, 5b, 5c, 5d (Step A3).

When the microwave powers supplied into the heating chamber 8 are 100% absorbed by the article to be heated 9, the reflected powers propagated from the heating chamber 8 to the feeding parts 5a, 5b, 5c, 5d become 0 W. However, load impedance of the heating chamber 8 is changed in accordance with a shape, a type, and an amount of the article to be heated 9, and due to mismatching with the supply side of the microwave powers, the reflected powers propagated from the feeding parts 5a, 5b, 5d, 5d to the amplification parts 4a, 4b, 4c, 4d are generated. The power detection parts 6a, 6b, 6c, 6d detect the reflected powers and output detection signals proportional to the amounts of the reflected powers to the control part 7. The control part 7 calculates the ratios of "reflected powers/incident powers" by the detected reflected powers and stores the calculated ratios with an operating frequency at that time (Step A4).

As described above, in the microwave heating apparatus of the first embodiment, in a preliminary stage before major heating processing of the article to be heated 9 accommodated in the heating chamber 8, preliminary heating processing is performed so as to execute the frequency detection action. In the frequency detection action, the control part 7 controls the oscillation parts 1a, 1b and detects the frequency characteristics relating to the reflected powers so as to extract the oscillating frequency with which the reflected powers detected by the power detection parts 6a, 6b, 6c, 6d is minimum. The oscillating frequency is decided in this extraction action, and the major heating processing is performed at the decided oscillating frequency. In this frequency detection action, the control part 7 operates the oscillating frequency of the oscillation parts 1a, 1b at a 1 MHz pitch from for example 2400 MHz until the frequency reaches 2500 MHz serving as the upper limit of the frequency variable range. At the same time, the power detection parts 6a, 6b, 6c, 6d detect the microwave powers (the reflected powers) reflected from the feeding parts 5a, 5b, 5c, 5d to the amplification parts 4a, 4b, 4c, 4d (Steps A2 to A6). Information on the reflected powers detected by the power detection parts 6a, 6b, 6c, 6d is transmitted to the control part 7, so that the frequency characteristics relating to the reflected powers in the microwave power supply parts 3a, 3b, 3c, 3d are calculated. Based on the calculated frequency characteristics of the microwave power supply parts 3a, 3b, 3c, 3d, the oscillating frequency with which the total reflected powers relative to the load are minimum is extracted and decided. In the microwave heating apparatus of the first embodiment, the ratios of "reflected powers/incident powers" are calculated and the frequency characteristics are decided, so that the oscillating frequency with which the total reflected powers are minimum is detected (Step A7). The frequency characteristic diagrams shown in FIGS. 2A and 2B show results of calculating the ratio of "reflected power/incident power" in a case where the patch antennas 51a, 51b with the diameters of 47 mm are respectively independently operated.

As described above, when the oscillating frequency with which the total reflected powers are minimum is decided in the power detection parts 6a, 6b, 6c, 6d, the control part 7 controls the oscillation parts 1a, 1b to oscillate at the decided oscillating frequency, and controls the outputs of the oscillation parts 1a, 1b and the amplification parts 4a, 4b, 4c, 4d to be the outputs corresponding to the heating condition set in the operation part. The microwaves at the oscillating frequency oscillated by the oscillation parts 1a, 1b in accordance with control of the control part 7 are inputted to the amplification parts 4a, 4b, 4c, 4d and amplified to the powers in accordance with the control by the control part 7. The outputs of the amplification parts 4a, 4b, 4c, 4d are respectively supplied to the feeding parts 5a, 5b, 5c, 5d, so that desired microwaves are emitted into the heating chamber 8. By emitting the desired microwaves into the heating chamber 8 in such a way, a major heating action to the article to be heated 9 is started. In the major heating action, the heating action time, the heating state of the article to be heated 9, and the like are detected. When the detected heating information satisfies the heating condition in the setting information, the major heating action is finished.

It should be noted that in a case where means for detecting physical information on the article to be heated 9 such as the surface temperature, size, and the amount of the article to be heated 9 is provided in the microwave heating apparatus of the first embodiment, it may be determined whether or not the heating is completed based on a detection signal of the detection means of the physical information. For example in a case where temperature detection means is used as the detection means of the physical information, it is determined whether or not a temperature reaches a predetermined temperature based on the setting information (such as 75° C.). In a case where the temperature reaches the predetermined temperature, the heating action is finished. In a case where means for detecting the size, the amount, or the like relating to the article to be heated 9 is provided, preliminarily determined heating action time relative to a range of the size or the amount is extracted in accordance with a processing method such as a cooking method based on the setting information, and finish of the major heating action may be determined based on whether or not time reaches the heating action time.

In the microwave heating apparatus of the first embodiment, the first microwave power supply part 3a is the diffusive microwave power supply part, and the two antennas 51a, 51b forming the first feeding part 5a have the different excitation directions of the microwaves to be supplied into the heating chamber 8, and are arranged at the different positions. Thus, the following effects are obtained.

The microwaves respectively emitted from the first antenna 51a and the second antenna 51b in the first microwave power supply part 3a have the electric fields in the different directions even at the same frequency. Thus, relative influences between the antennas are reduced, and the transmission power is suppressed to a large extent. Therefore, in the first feeding part 5a, interference of the emitted microwaves between the antennas is suppressed, so that emission performance of the respective antennas can be surely obtained at the same time without the relative influences upon microwave feeding from a plurality of points on the bottom wall surface.

In the microwave heating apparatus of the first embodiment, the two antennas 51a, 51b have the similar frequency characteristics, and the oscillating frequencies of the minimum reflected powers substantially correspond to each other. Thus, by oscillating at the same frequency, the reflected powers can be suppressed to a large extent, so that a highly efficient heating action can be realized.

Further, in the first microwave power supply part 3a in the microwave heating apparatus of the first embodiment, all the microwave powers reflected from both the two antennas 51a, 51b can be detected by one power detection part 6a. Thus, the detection action and a control action can be easily performed, so that the configuration can be simplified.

It should be noted that although the configuration that the first feeding part 5a provided on the bottom wall surface has the antennas having the different specifications is described in the microwave heating apparatus of the first embodiment, the other feeding parts 5b, 5c, 5d can similarly have two antennas, so that the highly efficient heating action is performed. The configurations of the feeding parts 5a, 5b, 5c, 5d are appropriately set in accordance with a specification of the microwave heating apparatus.

In the configuration of the microwave heating apparatus of the first embodiment, the microwave powers can be fed from a large number of positions to the heating chamber with a small number of the oscillation parts and the amplification parts. Thus, the heating can be performed from the directions suitable for the article to be heated, and heating unevenness is improved, so that the heating capable of high quality cooking can be performed.

In the microwave heating apparatus of the first embodiment, the frequency detection action is performed as above, and the heating action at the optimal frequency is executed. Thus, the highly efficient heating can be performed under the heating condition set for various articles to be heated of different shapes, size, and amounts.

Further, in the microwave heating apparatus of the first embodiment, the reflected powers reflected to the amplification parts are suppressed to a large extent. Thus, excessive heat generation of the semiconductor elements provided in the amplification parts due to the reflected powers is prevented, so that thermal destruction of the semiconductor elements is prevented.

Second Embodiment

Figure 6:
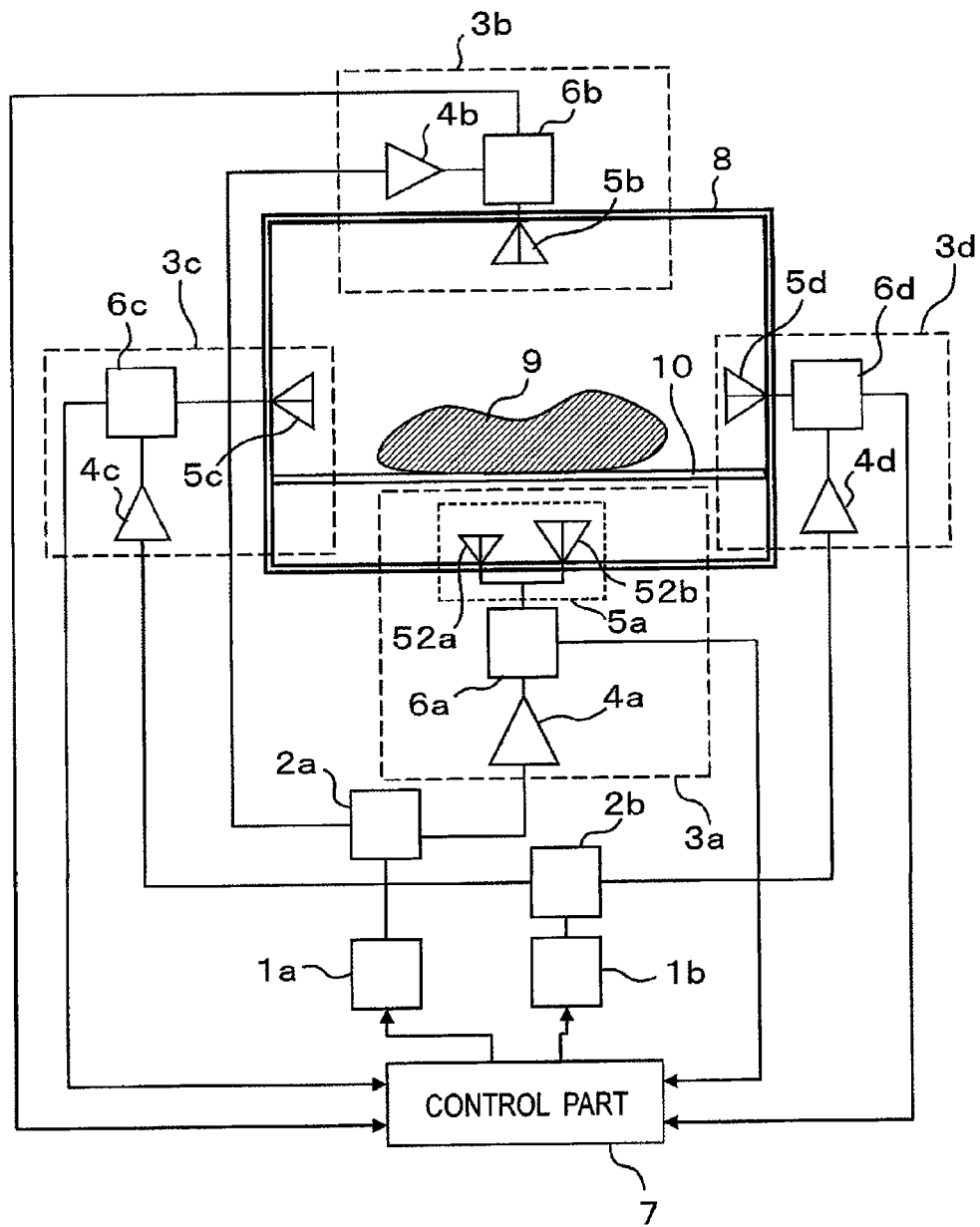
FIG. 6 is a block diagram showing a configuration of a microwave generation part in a microwave heating apparatus of a second embodiment according to the present invention.

In a microwave heating apparatus of a second embodiment according to the present invention, specifications of two antennas forming the feeding part are different from the microwave heating apparatus of the first embodiment, and the other configurations are the same as the microwave heating apparatus of the first embodiment. FIG. 6 is a block diagram showing a configuration of a microwave generation part in the microwave heating apparatus of the second embodiment. In the following description of the second embodiment, constituent elements having the same function and configuration as the microwave heating apparatus of the first embodiment will be given the same reference numerals, detailed description thereof will not be repeated, and the description of the first embodiment will be applied.

As shown in FIG. 6, the first feeding part 5a in the microwave heating apparatus of the second embodiment is provided on the bottom wall surface below the base 10, and formed by two antennas 52a, 52b provided at different positions on the bottom wall surface. The radiation antennas such as the patch antennas and the monopole antennas are used as the first antenna 52a and the second antenna 52b. In the microwave heating apparatus of the second embodiment, the patch antennas are used as the first antenna 52a and the second antenna 52b.

In the microwave heating apparatus of the second embodiment, the first microwave power supply part 3a is formed by the first feeding part 5a having the first antenna 52a and the second antenna 52b, the first amplification 4a, and the first power detection part 6a. Similarly, the second microwave power supply part 3b is formed by the second feeding part 5b, the second amplification part 4b, and the second power detection part 6b, the third microwave power supply part 3c is formed by the third feeding part 5c, the third amplification part 4c, and the third power detection part 6c, and the fourth microwave power supply part 3d is formed by the fourth feeding part 5d, the fourth amplification part 4d, and the fourth power detection part 6d. In the microwave heating apparatus of the second embodiment, the first feeding part 5a has the two antennas 52a, 52b, and the other second to fourth feeding parts 5b, 5c, 5d respectively have one antenna. However, the present invention is not limited to such a configuration but the second to fourth feeding parts 5b, 5c, 5d may respectively have two antennas.

As described above, since the first microwave power supply part 3a has the two antennas 52a, 52b, the microwave heating apparatus of the second embodiment has the function of emitting the microwaves from two positions on the bottom wall surface into the heating chamber 8. The two antennas 52a, 52b provided in the first microwave power supply part 3a have different specifications to each other. Specifically, frequency characteristics relating to the reflected powers are different from each other. That is, the two antennas 52a, 52b have the frequency characteristics with which the frequency values indicating the minimum reflected power are different from each other.

Next, specific configurations of the two antennas 52a, 52b provided in the first microwave power supply part 3a in the microwave heating apparatus of the second embodiment will be described.

In the second embodiment, the first antenna 52a is the circular patch antenna with the diameter of 47 mm, and the second antenna 52b is the circular patch antenna with the diameter of 50 mm. The first antenna 52a and the second antenna 52b are arranged at the different positions on the bottom wall surface of the heating chamber 8, and the excitation directions thereof are the same directions. The first antenna 52a and the second antenna 52b are arranged at the equal distances to the part immediately below the center of the position where the article to be heated 9 is mounted but may be arranged side by side in the vicinity of the part immediately below the center.

In the microwave heating apparatus of the second embodiment, the patch antenna with the diameter of 47 mm having the frequency characteristic shown in FIG. 2A described in the above first embodiment is used as the first antenna 52a.

The patch antenna with the diameter of 50 mm having the frequency characteristic shown in FIG. 3A is used as the second antenna 52b. Therefore, the first antenna 52a has the frequency characteristic with which the amount of the reflected power is the lowest in the vicinity of the frequency of 2.47 GHz, and the second antenna 52b has the frequency characteristic with which the amount of the reflected power is the lowest in the vicinity of the frequency of 2.43 GHz.

In the first microwave power supply part 3a in the microwave heating apparatus of the second embodiment, the output of one amplification part 4a is supplied to the two antennas 52a, 52b provided in the first feeding part 5a, and the plurality of microwaves having the different characteristics can be emitted from the antennas 52a, 52b into the heating chamber 8. The first microwave power supply part 3a in the microwave heating apparatus of the second embodiment formed in such a way is called as the diffusive microwave power supply part.

Next, a heating action in the microwave heating apparatus of the second embodiment formed as above will be described. Since the substantially similar action to the microwave heating apparatus of the above first embodiment is performed, the microwave heating apparatus of the second embodiment will be briefly described with reference to the flowcharts shown in FIGS. 4 and 5.

When the article to be heated 9 is accommodated in the heating chamber 8, the heating condition for the article to be heated 9 is inputted in the operation part, and the heating start key is pressed, the heating start signal is inputted to the control part 7 (Step 101 in FIG. 4). The control part 7 to which the heating start signal is inputted starts up the drive power supply and respectively supplies the drive power voltages to the oscillation parts 1a, 1b and the amplification parts 4a, 4b, 4c, 4d so as to start the frequency detection action (Step 102 in FIG. 4).

The control part 7 inputs the control signals for setting the initial oscillating frequency of the oscillation parts 1a, 1b to for example 2400 MHz to the oscillation parts 1a, 1b (Step A1 in FIG. 5). The oscillation parts 1a, 1b to which the control signals are inputted oscillate at the initial oscillating frequency (Step A2 in FIG. 5). The microwaves outputted from the oscillation parts 1a, 1b are inputted to the amplification parts 4a, 4b, 4c, 4d controlled by the control part 7. The microwave powers amplified to the predetermined powers in the amplification parts 4a, 4b, 4c, 4d which are operated in parallel are respectively outputted to the feeding parts 5a, 5b, 5c, 5d via the power detection parts 6a, 6b, 6c, 6d, and fed into the heating chamber 8.

In the microwave heating apparatus of the second embodiment, as well as the above first embodiment, in the preliminary stage before the major heating processing of the article to be heated 9 accommodated in the heating chamber 8, the preliminary heating processing is performed so as to execute the frequency detection action. In the frequency detection action, the control part 7 controls the oscillation parts 1a, 1b and detects the frequency characteristics relating to the reflected powers so as to extract the oscillating frequency with which the total reflected powers detected by the power detection parts 6a, 6b, 6c, 6d are minimum. The oscillating frequency is decided in this extraction action, and the major heating processing is performed at the decided oscillating frequency. In this frequency detection action, the control part 7 operates the oscillating frequency of the oscillation parts 1a, 1b at a 1 MHz pitch from for example 2400 MHz until the frequency reaches 2500 MHz serving as the upper limit of the frequency variable range. At the same time, the power detection parts 6a, 6b, 6c, 6d detect the microwave powers reflected from the feeding parts 5a, 5b, 5c, 5d to the amplification parts 4a, 4b, 4c, 4d (Steps A2 to A6 in FIG. 5). The information on the reflected powers detected by the power detection parts 6a, 6b, 6c, 6d is transmitted to the control part 7, so that the frequency characteristics relating to the reflected powers in the microwave power supply parts 3a, 3b, 3c, 3d are calculated. Based on the calculated frequency characteristics of the microwave power supply parts 3a, 3b, 3c, 3d, the oscillating frequency with which the total reflected powers relative to the load are minimum is decided. In the microwave heating apparatus of the second embodiment, the ratios of "reflected powers/incident powers" are calculated and the frequency characteristics are obtained, so that the oscillating frequency with which the reflected powers are minimum is decided (Step A7 in FIG. 5).

As described above, when the oscillating frequency with which the total reflected powers are minimum is decided in the power detection parts 6a, 6b, 6c, 6d, the control part 7 controls the oscillation parts 1a, 1b to oscillate at the decided oscillating frequency, and controls the outputs of the oscillation parts 1a, 1b and the amplification parts 4a, 4b, 4c, 4d to be the outputs corresponding to the heating condition set in the operation part. The microwaves at the oscillating frequency oscillated by the oscillation parts 1a, 1b in accordance with the control of the control part 7 are inputted to the amplification parts 4a, 4b, 4c, 4d and amplified to the powers in accordance with the control by the control part 7. The outputs of the amplification parts 4a, 4b, 4c, 4d are respectively supplied to the feeding parts 5a, 5b, 5c, 5d, so that the desired microwaves are emitted into the heating chamber 8. By emitting the desired microwaves into the heating chamber 8 in such a way, the major heating action to the article to be heated 9 is started. In the major heating action, the heating action time, the heating state of the article to be heated 9, and the like are detected. When the detected heating information satisfies the heating condition in the setting information, the major heating action is finished.

In the microwave heating apparatus of the second embodiment, the first microwave power supply part 3a is the diffusive microwave power supply part, and the two antennas 52a, 52b forming the first feeding part 5a respectively have the frequency characteristics with which the frequency values indicating the minimum reflected powers are different from each other. Thus, the following effects are obtained.

In the microwave heating apparatus of the second embodiment, the first antenna 52a and the second antenna 52b in the first microwave power supply part 3a emit the microwaves at the same frequency. However, by feeding the microwaves at the frequency with which the reflected power is minimum in the frequency characteristic detected by the first power detection part 6a, any one of the first antenna 52a and the second antenna 52b, which has more emission efficiency mainly emits the microwave into the heating chamber 8. This is because the first antenna 52a and the second antenna 52b have the frequency characteristics as shown in FIGS. 2A and 3A. As shown in FIG. 2A, in the frequency characteristic of the first antenna 52a, the frequency with which the reflected power is minimum is in the vicinity of 2.47 GHz. Meanwhile, as shown in FIG. 3A, in the frequency characteristic of the second antenna 52b, the frequency with which the reflected power is minimum is in the vicinity of 2.43 GHz. Therefore, in a case where the microwaves are oscillated at the frequency indicating the minimum total reflected powers and supplied into the heating chamber 8, in accordance with the oscillating frequency, any one of the first antenna 52a and the second antenna 52b mainly emits the microwave into the heating chamber 8.

As described above, in the microwave heating apparatus of the second embodiment, when the oscillation part 1a oscillates at the decided oscillating frequency, the antenna which has more emission efficiency at the oscillating frequency mainly supplies the microwave power to the heating chamber 8. Therefore, when the control part 7 decides the oscillating frequency based on detection results by the power detection parts 6a, 6b, 6c, 6d, and controls at the oscillating frequency, any one of the antennas 52a and 52b, which is suitable as the antenna on the bottom wall surface is selected in the heating of the article to be heated 9. In such a way, in the microwave heating apparatus of the second embodiment, by covering the frequency range from 2400 MHz to 2500 MHz to be emitted from the bottom wall surface by the plurality of antennas 52a, 52b, more highly efficient heating can be performed in accordance with the article to be heated 9 in a wide frequency range.

Therefore, in the microwave heating apparatus of the second embodiment, in accordance with the load impedance changed due to a position, the shape, the size, the amount, and the like of the article to be heated 9, highly efficient and optimal heating can be performed.

In the first microwave power supply part 3a in the microwave heating apparatus of the second embodiment, all the microwave powers reflected from both the two antennas 52a, 52b can be detected by one power detection part 6a. Thus, the detection action and the control action can be easily performed, so that the configuration can be simplified.

In the microwave heating apparatus of the second embodiment, the first feeding part 5a is formed with using the antennas having the different specifications as described above. Thus, the frequency range with which the highly efficient heating can be performed is extended, so that the optimal frequency can be selected from the wide frequency range in accordance with the various articles to be heated.

In the configuration of the microwave heating apparatus of the second embodiment, the microwaves can be fed from a large number of positions into the heating chamber with a small number of the oscillation parts and the amplification parts. Thus, the heating can be performed from the directions suitable for the article to be heated, and the heating unevenness is improved, so that the heating capable of the high quality cooking can be performed.

In the microwave heating apparatus of the second embodiment, the microwave power from one of the amplification parts is emitted from the optimal antenna in the feeding part into the heating chamber. Without using a specific output switching mechanism, a desired microwave power is fed into the heating chamber in a state that the optimal antenna is substantially selected from the plurality of antennas.

In the microwave heating apparatus of the second embodiment, the frequency detection action is executed as above, and the preliminary heating action is performed. Thus, the highly efficient heating can be performed in accordance with the position of the article to be heated in the heating chamber under the heating condition optimally set for various shapes, size, and amounts of the article to be heated.

In the microwave heating apparatus of the second embodiment, the reflected powers reflected to the amplification parts are suppressed to a large extent. Thus, the excessive heat generation of the semiconductor elements provided in the amplification parts due to the reflected powers is prevented, so that the thermal destruction of the semiconductor elements is prevented.

It should be noted that although the example that the antennas having the different specifications with the different frequency characteristics relating to the reflected powers are used as the two antennas 52a, 52b provided in the first microwave power supply part 3a is described in the microwave heating apparatus of the second embodiment, the antennas having the different frequency characteristics with which the frequency values indicating the minimum reflected powers are different from each other and at the same time having the different excitation directions can also be used. In the microwave heating apparatus formed in such a way, the microwaves emitted from the two antennas 52a, 52b have the electric fields of the microwaves in the different directions. Thus, the relative influences between the antennas are reduced, and the transmission power between the two antennas 52a, 52b is suppressed to a large extent. Therefore, in the first feeding part 5a, the interference of the emitted microwaves between the antennas is suppressed, so that the emission performance of the respective antennas can be surely obtained at the same time without the relative influences between the antennas upon the microwave feeding from the plurality of points on the same wall surface.

Third Embodiment

Figure 7:
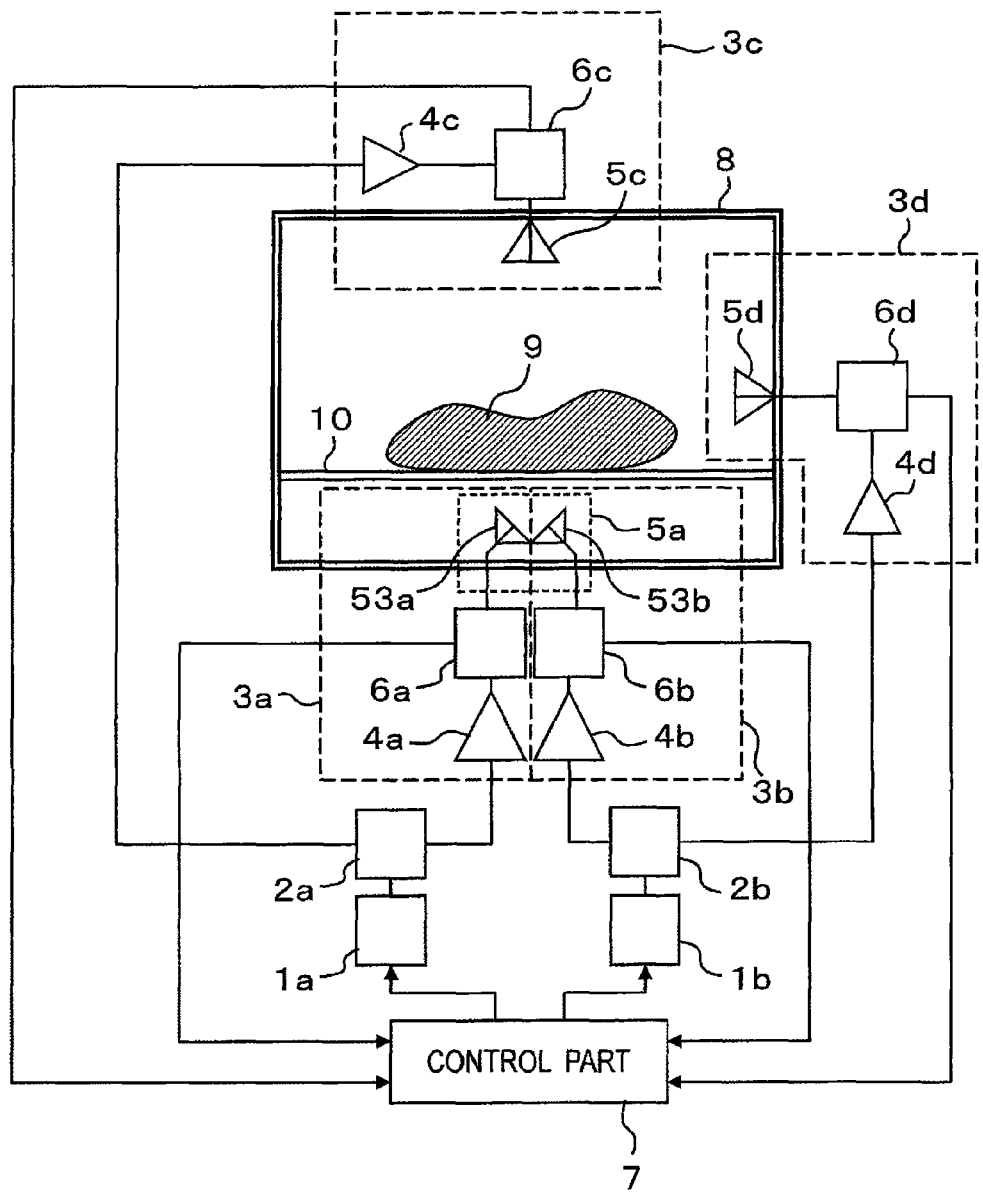
FIG. 7 is a block diagram showing a configuration of a microwave generation part in a microwave heating apparatus of a third embodiment according to the present invention.

In a microwave heating apparatus of a third embodiment according to the present invention, configurations of the microwave power supply parts are different from the microwave heating apparatus of the first embodiment, and the other configurations are the same as the microwave heating apparatus of the first embodiment. FIG. 7 is a block diagram showing a configuration of a microwave generation part in the microwave heating apparatus of the third embodiment. In the following description of the third embodiment, constituent elements having the same function and configuration as the microwave heating apparatus of the first embodiment will be given the same reference numerals, detailed description thereof will not be repeated, and the description of the first embodiment will be applied.

As shown in FIG. 7, in the microwave heating apparatus of the third embodiment, the first microwave power supply part 3a and the second microwave power supply part 3b share the first feeding part 5a. The first feeding part 5a is formed by an integrated antenna having two feeding points for emitting the microwaves running in the different excitation directions, such as a two-point feeding patch antenna. This two-point feeding patch antenna is a patch antenna of an integrated structure substantially having two antennas 53a, 53b for emitting the microwaves running in the different excitation directions.

Figure 8:
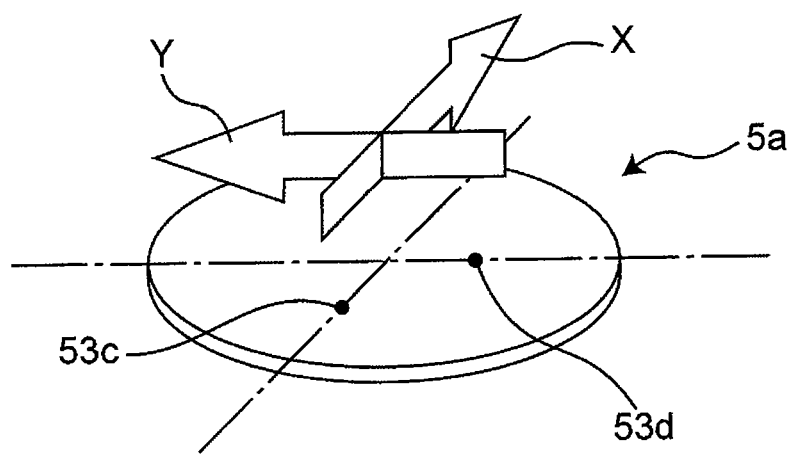
FIG. 8 is a schematic diagram for illustrating a two-point feeding patch antenna in the microwave heating apparatus of the third embodiment.

FIG. 8 is a schematic diagram for illustrating the two-point feeding patch antenna used in the microwave heating apparatus of the third embodiment. As shown in FIG. 8, the two-point feeding patch antenna is the patch antenna having a first feeding point 53c and a second feeding point 53d. An electric field in the direction shown by an arrow of the symbol X is generated by the microwave power supplied to the first feeding point 53c, and an electric field in the direction shown by an arrow of the symbol Y is generated by the microwave power supplied to the second feeding point 53d. The electric field in the arrow X direction and the electric field in the arrow Y direction are orthogonal to each other.

It should be noted that although the circular two-point feeding patch antenna is described in the microwave heating apparatus of the third embodiment, the shape is not limited as long as the antenna is an integrated antenna having a plurality of feeding points but may be a polygon such as a rectangle.

In the microwave heating apparatus of the third embodiment, the two-point feeding patch antenna serving as the first feeding part 5a is provided on the bottom wall surface, and the two antennas 53a, 53b serving as the two-point feeding patch antenna are arranged at positions immediately below a center of the base 10 on which the article to be heated 9 is mounted in the heating chamber 8. That is, the two-point feeding patch antenna is provided immediately below a center of an area where the article to be heated 9 is mounted so as to emit the microwaves from the lower side to the article to be heated 9. The microwave power from the first amplification part 4a is supplied to the first feeding point 53c of the first antenna 53a, and the microwave power from the second amplification part 4b is supplied to the second feeding point 53d of the second antenna 53b. The first power detection part 6a is provided in the microwave transmission passage between the first antenna 53a and the first amplification part 4a, and the second power detection part 6b is provided in the microwave transmission passage between the second antenna 53b and the second amplification part 4b.

As described above, in the microwave heating apparatus of the third embodiment, the first microwave power supply part 3a has the first antenna 53a of the first feeding part 5a, the first amplification part 4a, and the first power detection part 6a. The second microwave power supply part 3b has the second antenna 53b of the first feeding part 5a, the second amplification part 4b, and the second power detection part 6b. The microwave divided in the first power division part 2a is inputted to and amplified in the first amplification part 4a. The microwave divided in the second power division part 2b is inputted to and amplified in the second amplification part 4b.

In the microwave heating apparatus of the third embodiment, the integrated first feeding part 5a has the plurality of antennas 53a, 53b, the outputs of the plurality of corresponding amplification parts 4a, 4b are respectively supplied to these antennas 53a, 53b, and the plurality of microwaves having the different characteristics is supplied from the plurality of antennas 53a, 53b into the heating chamber 8. The microwave power supply parts 3a, 3b having the first feeding part 5a formed in such a way are collectively called as an intensive microwave power supply part.

In the microwave heating apparatus of the third embodiment, the third microwave power supply part 3c has the third amplification part 4c for amplifying the microwave divided in the first power division part 2a, the third antenna 5c provided on the ceiling wall surface of the heating chamber 8, and the third power detection part 6c provided in the microwave transmission passage between the third amplification part 4c and the third antenna 5c. The fourth microwave power supply part 3d has the fourth amplification part 4d for amplifying the microwave divided in the second power division part 2b, the fourth antenna 5d provided on the right wall surface of the heating chamber 8 (the wall surface on the right side in FIG. 7), and the fourth power detection part 6d provided in the microwave transmission passage between the fourth amplification part 4d and the fourth antenna 5d.

As described above, the example that the first feeding part 5a in the third embodiment is formed by the two-point feeding patch antenna is described. However, an antenna having a plurality of microwave powers input parts with different excitation directions can be similarly used. The excitation directions of the microwaves to be emitted from the first feeding part 5a into the heating chamber 8 are two directions, and the microwaves running in the excitation directions are respectively excited in the above antennas 53a, 53b. Therefore, in the microwave heating apparatus of the third embodiment, the first microwave power supply part 3a and the second microwave power supply part 3b share one feeding part 5a, and the microwave emission performance of the microwave power supply parts is surely provided at the same time.

Next, a heating action in the microwave heating apparatus of the third embodiment formed as above will be described. Since the substantially similar action to the microwave heating apparatus of the above first embodiment is performed, the microwave heating apparatus of the third embodiment will be briefly described with reference to the flowcharts shown in FIGS. 4 and 5.

When the article to be heated 9 is accommodated in the heating chamber 8, the heating condition for the article to be heated 9 is inputted in the operation part, and the heating start key is pressed, the heating start signal is inputted to the control part 7 (Step 101 in FIG. 4). The control part 7 to which the heating start signal is inputted starts up the drive power supply and respectively supplies the drive power voltages to the oscillation parts 1a, 1b and the amplification parts 4a, 4b, 4c, 4d so as to start the frequency detection action (Step 102 in FIG. 4).

The control part 7 inputs the control signals for setting the initial oscillating frequency of the oscillation parts 1a, 1b to for example 2400 MHz to the oscillation parts 1a, 1b (Step A1 in FIG. 5). The oscillation parts 1a, 1b to which the control signals are inputted oscillate at the initial oscillating frequency (Step A2 in FIG. 5). The microwaves outputted from the oscillation parts 1a, 1b are inputted to the amplification parts 4a, 4b, 4c, 4d controlled by the control part 7. The microwave powers amplified to the predetermined powers in the amplification parts 4a, 4b, 4c, 4d which are operated in parallel are respectively outputted to the feeding parts 5a, 5c, 5d via the power detection parts 6a, 6b, 6c, 6d, and fed to the heating chamber 8. At this time, the microwave powers from the first amplification part 4a and the second amplification part 4b are respectively supplied to the two feeding points in the first feeding part 5a.

In the microwave heating apparatus of the third embodiment, as well as the above first embodiment, in the preliminary stage before the major heating processing of the article to be heated 9 accommodated in the heating chamber 8, the preliminary heating processing is performed so as to execute the frequency detection action. In the frequency detection action, the control part 7 controls the oscillation parts 1a, 1b and detects the frequency characteristics relating to the reflected powers so as to extract the oscillating frequency with which the reflected powers detected by the power detection parts 6a, 6b, 6c, 6d are minimum. The oscillating frequency is decided in this extraction action, and the major heating processing is performed at the decided oscillating frequency. In this frequency detection action, the control part 7 operates the oscillating frequency of the oscillation parts 1a, 1b at a 1 MHz pitch from for example 2400 MHz until the frequency reaches 2500 MHz serving as the upper limit of the frequency variable range. At the same time, the power detection parts 6a, 6b, 6c, 6d detect the microwave powers reflected from the feeding parts 5a, 5c, 5d to the amplification parts 4a, 4b, 4c, 4d (Steps A2 to A6 in FIG. 5). The information on the reflected powers detected by the power detection parts 6a, 6b, 6c, 6d is transmitted to the control part 7, so that the frequency characteristics relating to the reflected powers in the microwave power supply parts 3a, 3b, 3c, 3d are calculated. Based on the calculated frequency characteristics of the microwave power supply parts 3a, 3b, 3c, 3d, the oscillating frequency with which the total reflected powers relative to the load are minimum is decided. In the microwave heating apparatus of the third embodiment, the ratios of "reflected powers/incident powers" are calculated and the frequency characteristics are obtained, so that the oscillating frequency with which the total reflected powers are minimum is decided (Step A7 in FIG. 5).

As described above, when the oscillating frequency with which the total reflected powers are minimum is decided in the power detection parts 6a, 6b, 6c, 6d, the control part 7 controls the oscillation parts 1a, 1b to oscillate at the decided oscillating frequency, and controls the outputs of the oscillation parts 1a, 1b and the amplification parts 4a, 4b, 4c, 4d to be the outputs corresponding to the heating condition set in the operation part. The microwaves at the oscillating frequency oscillated by the oscillation parts 1a, 1b in accordance with the control of the control part 7 are inputted to the amplification parts 4a, 4b, 4c, 4d and amplified to the powers in accordance with the control by the control part 7. The outputs of the amplification parts 4a, 4b, 4c, 4d are respectively supplied to the feeding parts 5a, 5c, 5d, so that the desired microwaves are emitted into the heating chamber 8. By emitting the desired microwaves into the heating chamber 8 in such a way, the major heating action to the article to be heated 9 is started. In the major heating action, the heating action time, the heating state of the article to be heated 9, and the like are detected. When the detected heating information satisfies the heating condition in the setting information, the major heating action is finished.

In the microwave heating apparatus of the third embodiment, the microwave powers from the amplification parts 4a, 4b are supplied to the two feeding points 53c, 53d of the two-point feeding patch antenna serving as the first feeding part 5a, and the microwaves running in the different excitation directions are emitted into the heating chamber 8. Therefore, upon microwave emission from the first feeding part 5a in the two excitation directions, the transmission power between the antennas and the interference of the emitted microwaves between the antennas are suppressed. Therefore, in the first feeding part 5a, while emitting the microwaves from the plurality of antennas 53a, 53b, the relative influences between the antennas are eliminated. Thus, the microwave emission performance of the antennas 53a, 53b can be surely provided at the same time.

In the microwave heating apparatus of the third embodiment, the microwave powers in the excitation directions reflected from the antennas 53a, 53b are separately detected by the first power detection part 6a and the second power detection part 6b. Thus, the heating condition suitable for the article to be heated 9 can be decided with high precision, so that the microwaves emitted to the heating chamber 8 can be efficiently absorbed by the article to be heated 9.

In the microwave heating apparatus of the third embodiment, the first feeding part 5a is provided in a center of the bottom wall surface among the wall surfaces forming the heating chamber 8 as the microwave power supply part. In general, the center part of the bottom wall surface of the heating chamber is a feeding position which is the closest to the article to be heated 9. Thus, in the microwave heating apparatus of the third embodiment, the first feeding part 5a is arranged at a position which is the most suitable for the highly efficient heating. In such a way, the first feeding part 5a having the plurality of antennas is arranged at the position which is the most suitable for heating the article to be heated 9. Thus, the plurality of microwaves running in the different excitation directions can be highly efficiently emitted to the article to be heated 9 for heating.

In the microwave heating apparatus of the third embodiment, the microwaves running in the different excitation directions are emitted from the feeding part arranged at the optimal position to the article to be heated 9. Thus, the article to be heated 9 can be highly efficiently heated without unevenness.

Further, in the microwave heating apparatus of the third embodiment, the microwaves running in the different excitation directions are emitted from the plurality of antennas of the feeding part arranged at the optimal position. Thus, predetermined microwaves can be surely fed to the heating chamber without the relative influences between the antennas.

In the microwave heating apparatus of the third embodiment, the heating action is executed as above. Thus, the highly efficient heating can be performed in accordance with the position of the article to be heated in the heating chamber under the heating condition set for the various shapes, size, and amounts of the article to be heated 9.

In the microwave heating apparatus of the third embodiment, the reflected powers reflected to the amplification parts are suppressed to a large extent. Thus, the excessive heat generation of the semiconductor elements provided in the amplification parts due to the reflected powers is prevented, so that the thermal destruction of the semiconductor elements is prevented.

Fourth Embodiment

Figure 9:
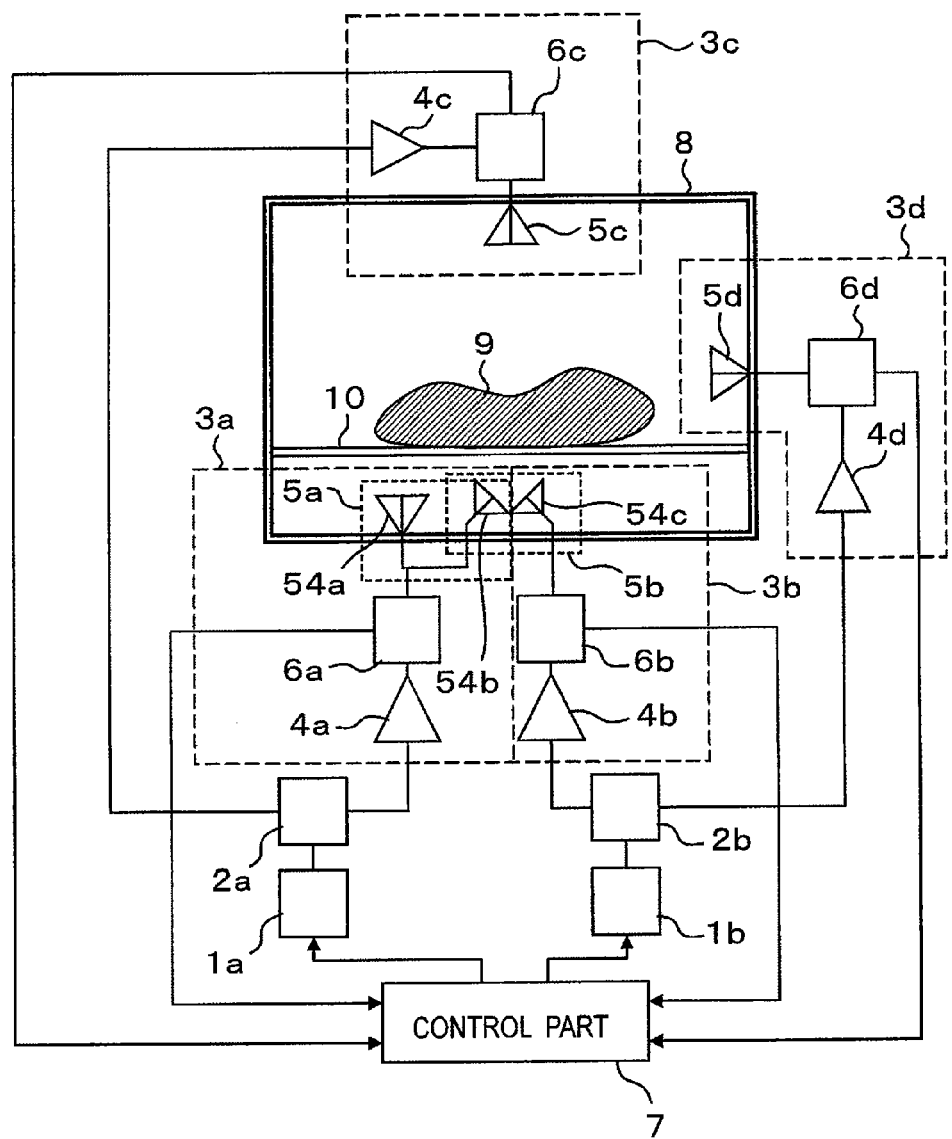
FIG. 9 is a block diagram showing a configuration of a microwave generation part in a microwave heating apparatus of a fourth embodiment according to the present invention.

In a microwave heating apparatus of a fourth embodiment according to the present invention, configurations of the microwave power supply parts are different from the microwave heating apparatus of the first embodiment, and the other configurations are the same as the microwave heating apparatus of the first embodiment. FIG. 9 is a block diagram showing a configuration of a microwave generation part in the microwave heating apparatus of the fourth embodiment. In the following description of the fourth embodiment, constituent elements having the same function and configuration as the microwave heating apparatus of the first embodiment will be given the same reference numerals, detailed description thereof will not be repeated, and the description of the first embodiment will be applied.

As shown in FIG. 9, in the microwave heating apparatus of the fourth embodiment, the first microwave power supply part 3a is formed by the first feeding part 5a having two antennas 54a, 54b, the first amplification part 4a, and the first power detection part 6a. The second microwave power supply part 3b is formed by the second feeding part 5b having two antennas 54b, 54c, the second amplification part 4b, and the second power detection part 6b. In such a way, the first feeding part 5a and the second feeding part 5b share one antenna 54b.

The two antennas 54a, 54b of the first feeding part 5a are specifically patch antennas having the frequency characteristics with which the frequency values indicating the minimum reflected powers are different from each other as used in the microwave heating apparatus of the above second embodiment, and are arranged at different positions on the bottom wall surface. Meanwhile, the two antennas 54b, 54c of the second feeding part 5b are specifically a two-point feeding patch antenna as shown in FIG. 8 above, which is an integrated antenna having the different excitation directions. Therefore, the microwave heating apparatus of the fourth embodiment has a configuration formed by combining technical features of the microwave heating apparatuses of the second and third embodiments. That is, in the microwave heating apparatus of the fourth embodiment, the first microwave power supply part 3a serves as the diffusive microwave power supply part, and the microwave power supply parts 3a, 3b collectively serve as the intensive microwave power supply part.

It should be noted that in the microwave heating apparatus of the fourth embodiment, the first microwave power supply part 3a and the second microwave power supply part 3b are formed as above, and the third microwave power supply part 3c and the fourth microwave power supply part 3d are formed similarly to the third microwave power supply part 3c and the fourth microwave power supply part 3d in the microwave heating apparatus of the above third embodiment.

The example that the three antennas 54a, 54b, 54c provided in the first microwave power supply part 3a and the second microwave power supply part 3b are provided on the bottom wall surface among the wall surfaces forming the heating chamber 8 is described in the microwave heating apparatus of the fourth embodiment. However, the present invention is limited to this configuration but the configurations of the first microwave power supply part 3a and the second microwave supply part 3b can be provided on the other wall surface, and the same effects are obtained.

Next, a heating action in the microwave heating apparatus of the fourth embodiment formed as above will be described. Since the substantially similar action to the microwave heating apparatus of the above first embodiment is performed, the microwave heating apparatus of the fourth embodiment will be briefly described with reference to the flowcharts shown in FIGS. 4 and 5.

When the article to be heated 9 is accommodated in the heating chamber 8, the heating condition for the article to be heated 9 is inputted in the operation part, and the heating start key is pressed, the heating start signal is inputted to the control part 7 (Step 101 in FIG. 4). The control part 7 to which the heating start signal is inputted starts up the drive power supply and respectively supplies the drive power voltages to the oscillation parts 1a, 1b and the amplification parts 4a, 4b, 4c, 4d so as to start the frequency detection action (Step 102 in FIG. 4).

The control part 7 inputs the control signals for setting the initial oscillating frequency of the oscillation parts 1a, 1b to for example 2400 MHz to the oscillation parts 1a, 1b (Step A1 in FIG. 5). The oscillation parts 1a, 1b to which the control signals are inputted oscillate at the initial oscillating frequency (Step A2 in FIG. 5). The microwaves outputted from the oscillation parts 1a, 1b are inputted to the amplification parts 4a, 4b, 4c, 4d controlled by the control part 7. The microwave powers amplified to the predetermined powers in the amplification parts 4a, 4b, 4c, 4d which are operated in parallel are respectively outputted to the feeding parts 5a, 5b, 5c, 5d via the power detection parts 6a, 6b, 6c, 6d, and fed to the heating chamber 8. At this time, the microwave power from the first amplification part 4a is supplied to the first feeding part 5a, and the microwave powers from the first amplification part 4a and the second amplification part 4b are respectively supplied to the two feeding points in the second feeding part 5b.

In the microwave heating apparatus of the fourth embodiment, as well as the above first embodiment, in the preliminary stage before the major heating processing of the article to be heated 9 accommodated in the heating chamber 8, the preliminary heating processing is performed so as to execute the frequency detection action. In the frequency detection action, the control part 7 controls the oscillation parts 1a, 1b and detects the frequency characteristics relating to the reflected powers so as to extract the oscillating frequency with which the total reflected powers detected by the power detection parts 6a, 6b, 6c, 6d are minimum. The oscillating frequency is decided in this extraction action, and the major heating processing is performed. In this frequency detection action, the control part 7 operates the oscillating frequency of the oscillation parts 1a, 1b at a 1 MHz pitch from for example 2400 MHz until the frequency reaches 2500 MHz serving as the upper limit of the frequency variable range. At the same time, the power detection parts 6a, 6b, 6c, 6d detect the microwave powers reflected from the feeding parts 5a, 5b, 5c, 5d to the amplification parts 4a, 4b, 4c, 4d (Steps A2 to A6 in FIG. 5). The information on the reflected powers detected by the power detection parts 6a, 6b, 6c, 6d is transmitted to the control part 7, so that the frequency characteristics relating to the reflected powers in the microwave power supply parts 3a, 3b, 3c, 3d are calculated. Based on the calculated frequency characteristics of the microwave power supply parts 3a, 3b, 3c, 3d, the oscillating frequency with which the total reflected powers relative to the load are minimum is decided. In the microwave heating apparatus of the fourth embodiment, the ratios of "reflected powers/incident powers" are calculated and the frequency characteristics are obtained, so that the oscillating frequency with which the total reflected powers are minimum is decided (Step A7 in FIG. 5).

As described above, when the oscillating frequency with which the total reflected powers are minimum is decided in the power detection parts 6a, 6b, 6c, 6d, the control part 7 controls the oscillation parts 1a, 1b to oscillate at the decided oscillating frequency, and controls the outputs of the oscillation parts 1a, 1b and the amplification parts 4a, 4b, 4c, 4d to be the outputs corresponding to the heating condition set in the operation part. The microwaves at the oscillating frequency oscillated by the oscillation parts 1a, 1b in accordance with the control of the control part 7 are inputted to the amplification parts 4a, 4b, 4c, 4d and amplified to the powers in accordance with the control by the control part 7. The outputs of the amplification parts 4a, 4b, 4c, 4d are respectively supplied to the feeding parts 5a, 5b, 5c, 5d, so that the desired microwaves are emitted into the heating chamber 8. By emitting the desired microwaves into the heating chamber 8 in such a way, the major heating action to the article to be heated 9 is started. In the major heating action, the heating action time, the heating state of the article to be heated 9, and the like are detected. When the detected heating information satisfies the heating condition in the setting information, the major heating action is finished.

In the microwave heating apparatus of the fourth embodiment, the first antenna 54a and the second antenna 54b forming the first feeding part 5a in the first microwave power supply part 3a have the frequency characteristics with which the frequency values indicating the minimum reflected powers are different from each other, and the second antenna 54b and the third antenna 54c forming the second feeding part 5b in the second microwave power supply part 3b have the different excitation directions. Thus, the following effects are obtained.

The first antenna 54a and the second antenna 54b in the first microwave power supply part 3a emit the microwaves at the same frequency. However, as described in the above second embodiment, any one of the first antenna 54a and the second antenna 54b mainly emits the microwave at the frequency indicating the minimum reflected power in the frequency characteristic detected by the first power detection part 6a into the heating chamber 8. Therefore, in a case where the microwave is oscillated at the frequency indicating the minimum reflected power in the frequency characteristic detected by the first power detection part 6a and supplied into the heating chamber 8, any one of the first antenna 54a and the second antenna 54b which is suitable for the oscillating frequency mainly emits the microwave into the heating chamber 8.

As described above, in the microwave heating apparatus of the fourth embodiment, when the oscillation part 1a oscillates at the decided oscillating frequency, the antenna which has more emission efficiency at the oscillating frequency mainly supplies the microwave power. Therefore, when the control part 7 controls the oscillating frequency based on the detection result by the first power detection part 6a, any one of the antennas 54a and 54b, which is suitable for the antenna on the bottom wall surface is selected in the heating of the article to be heated 9. In such a way, in the microwave heating apparatus of the fourth embodiment, by covering the frequency range from 2400 MHz to 2500 MHz to be emitted from the bottom wall surface by the plurality of antennas 54a, 54b, the more highly efficient heating can be performed in accordance with the article to be heated 9 in the wide frequency range.

Therefore, in the microwave heating apparatus of the fourth embodiment, in accordance with the load impedance changed due to the position, the shape, the size, the amount, and the like of the article to be heated 9, the highly efficient and optimal heating can be performed.

In the first microwave power supply part 3a in the microwave heating apparatus of the fourth embodiment, all the microwave powers reflected from both the two antennas 54a, 54b can be detected by one power detection part 6a. Thus, the detection action and the control action can be easily performed, so that the configuration can be simplified.

In the microwave heating apparatus of the fourth embodiment, the microwave powers from the amplification parts 4a, 4b is supplied to the two feeding points of the two-point feeding patch antenna serving as the second feeding part 5b. The microwaves running in the different excitation directions are emitted from the second feeding part 5b to which the microwave power is supplied in such a way into the heating chamber 8. Therefore, with the microwave emission from the second feeding part 5b in the two excitation directions, the transmission power between the antennas, and the interference of the emitted microwaves between the antennas are suppressed. As a result, in the second feeding part 5b, while emitting the microwaves from the plurality of antennas 54b, 54c, the relative influences between the antennas are eliminated. Thus, the emission performance of the antennas 54b, 54c can be surely provided at the same time.

In the microwave heating apparatus of the fourth embodiment, the first power detection part 6a detects the reflected powers from the antennas 54a, 54b, and the second power detection part 6b detects the reflected power from the antenna 54c. The reflected powers from the plurality of antennas provided on the bottom wall surface of the heating chamber 8 are detected by the separate power detection parts 6a, 6b. Therefore, in the microwave heating apparatus of the fourth embodiment, the heating condition which is optimal for the article to be heated 9 can be decided with high precision from the feeding parts on the bottom wall surface of the heating chamber 8, so that the microwaves emitted to the heating chamber 8 can be highly efficiently absorbed by the article to be heated 9.

As described above, in the microwave heating apparatus of the fourth embodiment, the microwaves are supplied from the plurality of feeding parts having the different specifications into the heating chamber. Thus, various heating conditions can be selected in accordance with the articles to be heated accommodated in the heating chamber.

In the microwave heating apparatus of the fourth embodiment, the microwave power from one of the amplification parts can be supplied from the antenna arranged at a more optimal position among the plurality of antennas arranged at the different positions, and the microwave powers from the plurality of amplification parts can be fed to the plurality of antennas which are integrated. Thus, various heating control can be selected within small space, so that the microwave heating apparatus is a highly reliable heating apparatus capable of surely achieving the optimal heating to the article to be heated.

In the microwave heating apparatus of the fourth embodiment, the heating action is executed as described above. Thus, the highly efficient heating can be performed in accordance with the position of the article to be heated in the heating chamber under the heating condition set for further various shapes, size, and amounts of the article to be heated.

In the microwave heating apparatus of the fourth embodiment, the reflected powers reflected to the amplification parts are suppressed to a large extent. Thus, the excessive heat generation of the semiconductor elements provided in the amplification parts due to the reflected powers is prevented, so that the thermal destruction of the semiconductor elements is prevented.

It should be noted that although the example that the antennas having the specifications with the different frequency characteristics relating to the reflected powers are used as the two antennas 54a, 54b of the first feeding part 5a is described in the microwave heating apparatus of the fourth embodiment, the antennas having the different excitation directions can also be used. In that case, preferably, the antenna 54a may be provided on a different wall surface or the like, so that the three antennas 54a, 54b, 54c have the different excitation directions from each other. With such a configuration, the similar effects to the microwave heating apparatus of the fourth embodiment can be obtained, and the transmission power generated between the antennas is suppressed, so that further effective heating to the various articles to be heated 9 can be expected.

The microwave heating apparatus of the fourth embodiment has the configuration formed by combining technical features of the above first embodiment and the third embodiment or the second embodiment and the third embodiment. Thus, the similar effects to the effects described in the above first, second and third embodiments are obtained.

INDUSTRIAL APPLICABILITY

In the microwave heating apparatus of the present invention, the plurality of feeding parts is optimally arranged on the wall surfaces of the heating chamber, and the frequency of the microwaves emitted from the feeding parts can be optimized. Thus, the microwave heating apparatus is useful for various applications such as a heating apparatus utilizing dielectric heating as represented by a microwave oven, a disposer, or a microwave power supply of a plasma power supply serving as a semiconductor manufacturing apparatus.

The invention claimed is:

1. A microwave heating apparatus, comprising:
a heating chamber accommodating an article to be heated;
an oscillation part for generating microwaves;
a power division part for dividing an output of the oscillation part into a plurality of outputs and outputting the divided outputs;
amplification parts for respectively amplifying the outputs of the power division part;
feeding parts for respectively supplying outputs of the amplification parts to the heating chamber;
power detection parts for detecting reflected powers transmitted from the heating chamber to the amplification parts via the feeding parts; and
a control part for controlling an oscillating frequency of the oscillation part, wherein
each of the feeding parts integrally has a plurality of antennas for supplying the microwaves having different characteristics to the heating chamber, wherein the plurality of antennas emits the microwaves having the different characteristics to the heating chamber, and the control part extracts the oscillating frequency at which a minimum reflected power is detected by the power detection parts, and causes the oscillation part to oscillate at the extracted oscillating frequency so as to supply the microwaves having the different characteristics from the plurality of antennas to the heating chamber.

2. The microwave heating apparatus according to claim 1, wherein
the output of one of the amplification parts is supplied to the plurality of antennas.

3. The microwave heating apparatus according to claim 2, wherein
the plurality of antennas emits the microwaves running in different excitation directions.

4. The microwave heating apparatus according to claim 2, wherein
the plurality of antennas has frequency characteristics with which frequency values indicating minimum reflected powers are different from each other.

5. The microwave heating apparatus according to claim 1, wherein
the outputs of the plurality of amplification parts are respectively and correspondingly supplied to the plurality of antennas in one of the feeding parts.

6. The microwave heating apparatus according to claim 5, wherein
the plurality of antennas emits the microwaves running in different excitation directions.

7. The microwave heating apparatus according to claim 5, wherein
each of the feeding parts having the plurality of antennas is a patch antenna having a plurality of feeding points.

8. The microwave heating apparatus according to claim 1, wherein
the output of one of the amplification parts is supplied to the plurality of antennas, and
at least one of the plurality of antennas is integrated with another antenna to which an output of the other amplification part is supplied.

9. The microwave heating apparatus according to claim 8, wherein
at least one of the plurality of antennas to which the output of one of the amplification parts is supplied and the other antenna to which the output of the other amplification part is supplied emit the microwaves running in different excitation directions.

10. The microwave heating apparatus according to claim 8, wherein
the plurality of antennas to which the output of one of the amplification parts is supplied has frequency characteristics with which frequency values indicating minimum reflected powers are different from each other.

11. The microwave heating apparatus according to claim 8, wherein
the plurality of antennas to which the output of one of the amplification parts is supplied emits the microwaves running in different excitation directions.

12. The microwave heating apparatus according to claim 1, further comprising:
a diffusive microwave power supply part in which the output of one of the amplification parts is supplied to the plurality of antennas provided in each of the feeding parts, and the plurality of microwaves having the different characteristics is supplied from the plurality of antennas to the heating chamber, wherein
the power detection parts are provided in microwave transmission passages between the amplification parts and the feeding parts so as to detect the reflected powers.

13. The microwave heating apparatus according to claim 1, further comprising:
an intensive microwave power supply part in which each of the feeding parts integrally has the plurality of antennas, the outputs of the plurality of amplification parts are respectively supplied to the plurality of antennas, and the plurality of microwaves having the different characteristics is supplied from the plurality of antennas to the heating chamber, wherein
the power detection parts are provided in microwave transmission passages between the amplification parts and the feeding parts so as to detect the reflected powers.

14. The microwave heating apparatus according to claim 1, provided with the feeding parts including a first feeding part and a second feeding part, the microwave heating apparatus further comprising:
a diffusive microwave power supply part in which the output of one of the amplification parts is supplied to the plurality of antennas provided in the first feeding part, and the plurality of microwaves having the different characteristics is supplied from the plurality of antennas of the first feeding part to the heating chamber; and
an intensive microwave power supply part in which the second feeding part integrally has the plurality of antennas, the outputs of the plurality of amplification parts are respectively supplied to the plurality of antennas of the second feeding part, and the plurality of microwaves having the different characteristics is supplied from the plurality of antennas of the second feeding part to the heating chamber, wherein
the power detection parts are provided in microwave transmission passages between the amplification parts and the feeding parts so as to detect the reflected powers.

* * * * *